(12) United States Patent
Dally

(10) Patent No.: US 9,389,617 B2
(45) Date of Patent: Jul. 12, 2016

(54) PULSED CURRENT SENSING

(71) Applicant: NVIDIA Corporation, Santa Clara, CA (US)

(72) Inventor: William J. Dally, Los Altos Hills, CA (US)

(73) Assignee: NVIDIA Corporation, Santa Clara, CA (US)

(*) Notice: Subject to any disclaimer, the term of this patent is extended or adjusted under 35 U.S.C. 154(b) by 393 days.

(21) Appl. No.: 13/770,975

(22) Filed: Feb. 19, 2013

(65) Prior Publication Data

US 2014/0232361 A1    Aug. 21, 2014

(51) Int. Cl.
*H02M 3/158* (2006.01)
*G05F 1/10* (2006.01)
*G01R 27/14* (2006.01)
*H02M 3/156* (2006.01)
*G06F 1/30* (2006.01)
*H02M 1/00* (2006.01)

(52) U.S. Cl.
CPC *G05F 1/10* (2013.01); *G01R 27/14* (2013.01); *G06F 1/305* (2013.01); *H02M 3/156* (2013.01); *H02M 2001/0009* (2013.01)

(58) Field of Classification Search
CPC ............... H02M 3/156–3/158; H02M 3/1588; H02M 2001/0009; Y02B 70/126; Y02B 7/1466
USPC .................. 323/222, 266, 271, 282–285, 351
See application file for complete search history.

(56) References Cited

U.S. PATENT DOCUMENTS

| | | | |
|---|---|---|---|
| 5,367,247 A | 11/1994 | Blocher et al. |
| 5,488,552 A | 1/1996 | Sakamoto et al. |
| 5,552,694 A | 9/1996 | Appeltans |
| 5,600,234 A | 2/1997 | Hastings et al. |
| 6,636,022 B2 | 10/2003 | Sluijs |
| 6,798,177 B1 | 9/2004 | Liu et al. |
| 6,961,251 B2 | 11/2005 | Porter et al. |
| 7,078,882 B2 | 7/2006 | Weng et al. |
| 7,141,957 B2 | 11/2006 | Tolle et al. |
| 7,298,116 B2 | 11/2007 | Sluijs |

(Continued)

FOREIGN PATENT DOCUMENTS

| | | |
|---|---|---|
| CN | 101018014 A | 8/2007 |
| CN | 101090234 A | 12/2007 |

(Continued)

OTHER PUBLICATIONS

Non-Final Office Action from U.S. Appl. No. 13/752,289, dated Oct. 6, 2014.

(Continued)

*Primary Examiner* — Yemane Mehari
(74) *Attorney, Agent, or Firm* — Zilka-Kotab, PC

(57) ABSTRACT

A system and method are provided for sensing current. A current source is configured to generate a current and a pulsed sense enable signal is generated. A sense voltage across a resistive sense mechanism is sampled according to the sense enable signal, where the sense voltage represents a measurement of the current. A system includes the current source and a current sensing unit. The current source is configured to generate a current. The current sensing unit is coupled the current source and is configured to generate a pulsed sense enable signal and sample the sense voltage across a resistive sense mechanism according to the pulsed sense enable signal.

20 Claims, 17 Drawing Sheets

(56) References Cited

U.S. PATENT DOCUMENTS

| | | | |
|---|---|---|---|
| 7,327,124 B2 | 2/2008 | Liu et al. | |
| 7,495,419 B1 | 2/2009 | Ju | |
| 7,501,805 B2 | 3/2009 | Chen et al. | |
| 7,557,554 B2* | 7/2009 | Chang | 323/284 |
| 7,733,072 B2 | 6/2010 | Kanakubo | |
| 7,782,027 B2 | 8/2010 | Williams | |
| 7,852,056 B2 | 12/2010 | Nishida | |
| 7,906,943 B2 | 3/2011 | Isobe et al. | |
| 7,906,949 B1 | 3/2011 | Sutardja et al. | |
| 7,977,930 B2* | 7/2011 | Chang | 323/285 |
| 8,111,052 B2 | 2/2012 | Glovinsky | |
| 8,237,421 B1 | 8/2012 | Shahani | |
| 8,508,208 B2 | 8/2013 | Klein | |
| 8,513,935 B2* | 8/2013 | Brokaw | 323/285 |
| 8,674,667 B2 | 3/2014 | Lin et al. | |
| 8,710,814 B1 | 4/2014 | Wile | |
| 8,710,820 B2 | 4/2014 | Parker | |
| 8,729,881 B2 | 5/2014 | Chang | |
| 8,860,387 B2 | 10/2014 | Kobayashi | |
| 2001/0046145 A1 | 11/2001 | Oknaian et al. | |
| 2002/0093315 A1 | 7/2002 | Sluijs | |
| 2002/0145891 A1 | 10/2002 | Ling | |
| 2004/0119446 A1 | 6/2004 | Harrington et al. | |
| 2005/0007080 A1 | 1/2005 | Wake | |
| 2005/0024908 A1 | 2/2005 | Gizara | |
| 2005/0068794 A1 | 3/2005 | Weng et al. | |
| 2005/0180236 A1 | 8/2005 | Thiele et al. | |
| 2005/0206358 A1 | 9/2005 | Van Der Horn et al. | |
| 2005/0258889 A1 | 11/2005 | Tolle et al. | |
| 2006/0043943 A1 | 3/2006 | Huang et al. | |
| 2006/0072252 A1 | 4/2006 | Sluijs | |
| 2007/0114985 A1 | 5/2007 | Latham et al. | |
| 2008/0055940 A1 | 3/2008 | Lawson et al. | |
| 2008/0150508 A1 | 6/2008 | Sohma | |
| 2008/0158915 A1 | 7/2008 | Williams | |
| 2008/0191678 A1 | 8/2008 | Feldtkeller et al. | |
| 2008/0252273 A1 | 10/2008 | Woo et al. | |
| 2008/0252276 A1 | 10/2008 | Omet et al. | |
| 2008/0303502 A1 | 12/2008 | Haiplik | |
| 2008/0315850 A1 | 12/2008 | Nishida | |
| 2009/0039852 A1 | 2/2009 | Fishelov et al. | |
| 2009/0059630 A1 | 3/2009 | Williams | |
| 2009/0079409 A1 | 3/2009 | Chang | |
| 2009/0115392 A1 | 5/2009 | Shimizu | |
| 2010/0194369 A1 | 8/2010 | Nagai et al. | |
| 2010/0231186 A1 | 9/2010 | Chen et al. | |
| 2010/0237845 A1 | 9/2010 | Scaldaferri et al. | |
| 2011/0156481 A1 | 6/2011 | Lin et al. | |
| 2011/0241637 A1 | 10/2011 | Parker | |
| 2012/0001610 A1 | 1/2012 | Klein | |
| 2012/0074916 A1 | 3/2012 | Trochut | |
| 2012/0078556 A1 | 3/2012 | Holmberg et al. | |
| 2012/0105034 A1 | 5/2012 | Brown et al. | |
| 2012/0217946 A1 | 8/2012 | Ju | |
| 2012/0229111 A1 | 9/2012 | Serdarevic | |
| 2012/0262140 A1 | 10/2012 | Divan | |
| 2013/0242616 A1 | 9/2013 | Oldenkamp | |
| 2014/0002053 A1 | 1/2014 | Wang et al. | |
| 2014/0084883 A1 | 3/2014 | Tanabe | |
| 2014/0097813 A1 | 4/2014 | Dally | |
| 2014/0210429 A1 | 7/2014 | Dally | |
| 2014/0210434 A1 | 7/2014 | Dally | |
| 2014/0218001 A1 | 8/2014 | Dally | |
| 2014/0225579 A1 | 8/2014 | Dally | |
| 2014/0232360 A1 | 8/2014 | Dally | |

FOREIGN PATENT DOCUMENTS

| | | |
|---|---|---|
| CN | 101167239 A | 4/2008 |
| CN | 101202510 A | 6/2008 |
| CN | 101330253 A | 12/2008 |
| CN | 101976960 A | 2/2011 |
| CN | 102064697 A | 5/2011 |
| CN | 102265234 A | 11/2011 |
| CN | 102315774 A | 1/2012 |
| CN | 102742135 A | 10/2012 |
| DE | 4334128 A1 | 4/1994 |
| DE | 10243885 A1 | 4/2004 |
| DE | 102013219793 A1 | 4/2014 |
| DE | 102013114656 A1 | 7/2014 |
| DE | 102013114097 A1 | 8/2014 |
| DE | 102013114588 A1 | 8/2014 |
| EP | 0508673 B1 | 6/1998 |
| TW | I278171 B | 4/2007 |
| TW | I299606 B | 8/2008 |
| TW | 200843311 A | 11/2008 |
| WO | 2011029875 A2 | 3/2011 |
| WO | 2012176006 A1 | 12/2012 |

OTHER PUBLICATIONS

Non-Final Office Action from U.S. Appl. No. 13/754,791, dated Sep. 11, 2014.
Non-Final Office Action from U.S. Appl. No. 13/759,964, dated Oct. 7, 2014.
Non-Final Office Action from U.S. Appl. No. 13/763,516, dated Oct. 7, 2014.
Non-Final Office Action from U.S. Appl. No. 13/770,982, dated Dec. 5, 2014.
Examination Report from German Patent Application No. 10 2013 114 248.6, dated Aug. 8, 2014.
Examination Report from German Patent Application No. 10 2013 114 656.2, dated Aug. 7, 2014.
Examination Report from German Patent Application No. 10 2013 114 588.4, dated Aug. 7, 2014.
Examination Report from German Patent Application No. 10 2013 114 097.1, dated Sep. 4, 2014.
Examination Report from German Patent Application No. 10 2013 114 331.8, dated Sep. 4, 2014.
Billings et al., "Switchmode Power Supply: Handbook," McGraw Hill, Third Edition, 2011, pp. 1.145-1.150; pp. 2.163-2.176; pp. 3.119-3.155.
Infineon, "High Current PN Half Bridge NovalithIC," Automotive Power, BTN7930 Data Sheet, Rev. 1.1, Nov. 2007, pp. 1-28.
Redl et al., "Ripple-Based Control of Switching Regulators—An Overview," IEEE Transaction on Power Electronics, vol. 24, No. 12, Dec. 2009, pp. 2669-2680.
Yousefzadeh et al., "Proximate Time-Optimal Digital Control for Synchronous Buck DC-DC Converters," EEE Transaction on Power Electronics, vol. 23, No. 4, Jul. 2008, pp. 2018-2026.
Office Action from Taiwan Patent Application No. 102142871, dated Feb. 3, 2015.
Final Office Action from U.S. Appl. No. 13/754,791, dated Apr. 20, 2015.
Office Action from Taiwan Patent Application No. 102147479, dated Apr. 21, 2015.
Office Action from Taiwan Patent Application No. 102146881, dated Apr. 15, 2015.
Office Action from Taiwan Patent Application No. 102141300, dated Feb. 24, 2015.
Office Action from Taiwan Patent Application No. 102144470, dated Apr. 22, 2015.
Rao, S. et al., "A 1.2-Buck-Boost LED Driver With On-Chip Error Averaged SenseFET-Based Current Sensing Technique," IEEE Journal of Solid-State Circuits, vol. 46, No. 12, Dec. 2011, pp. 1-12.
Mengmeng Du et al., "An Integrated Speed- and Accuracy-Enhanced CMOS Current Sensor With Dynamically Biased Shunt Feedback for Current-Mode Buck Regulators," IEEE Transactions on Circuits and Systems—I: Regular Papers, vol. 57, No. 10, Oct. 2010, pp. 2804-2814.
Office Action from Taiwan Patent Application No. 102142875, dated Feb. 3, 2015.
Final Office Action from U.S. Appl. No. 13/759,964, dated Jun. 5, 2015.
Non-Final Office Action from U.S. Appl. No. 13/752,289, dated Jun. 8, 2015.
Final Office Action from U.S. Appl. No. 13/770,982, dated Jul. 16, 2015.

(56) References Cited

OTHER PUBLICATIONS

Advisory Action from U.S. Appl. No. 13/754,791, dated Jul. 9, 2015.
Final Office Action from U.S. Appl. No. 13/763,516, dated Jun. 19, 2015.
Advisory Action from U.S. Appl. No. 13/759,964, dated Aug. 27, 2015.
Final Office Action from U.S. Appl. No. 13/752,289, dated Oct. 6, 2015.
Advisory Action from U.S. Appl. No. 13/770,982, dated Oct. 6, 2015.
Office Action from Chinese Patent Application No. 201310745918.4, dated Dec. 2, 2015.
Non-Final Office Action from U.S. Appl. No. 13/759,964, dated Dec. 22, 2015.
Office Action from Chinese Patent Application No. 201310745983.7, dated Dec. 18, 2015.
Final Office Action from U.S. Appl. No. 13/754,791, dated Jan. 8, 2016.
Notice of Allowance from U.S. Appl. No. 13/763,516, dated Dec. 31, 2015.
Non-Final Office Action from U.S. Appl. No. 13/770,982, dated Jan. 13, 2016.
Advisory Action from U.S. Appl. No. 13/752,289, dated Jan. 25, 2016.
Notice of Allowance from U.S. Appl. No. 13/752,289, dated Mar. 17, 2016.
Final Office Action from U.S. Appl. No. 13/759,964, dated Apr. 8, 2016.
Non-Final Office Action from U.S. Appl. No. 13/754,791, dated May 16, 2016.
Notice of Allowance from U.S. Appl. No. 13/763,516, dated May 20, 2016.

\* cited by examiner

PULSED CURRENT SENSING

FIELD OF THE INVENTION

The present invention relates to regulator circuits, and more specifically to sensing current.

BACKGROUND

Conventional devices such as microprocessors and graphics processors that are used in high-performance digital systems may have varying current demands based on the processing workload. For example, current demands may increase dramatically when a block of logic is restarted after a stall or when a new request initiates a large computation such as the generation of a new image. Conversely, current demands may decrease dramatically when a block of logic becomes idle. When the current demand increases and sufficient power is not available, the supply voltage that is provided to the device may drop below a critical voltage level, potentially causing the device to fail to function properly. When the current demand decreases and the supply voltage that is provided to the device rises above a critical voltage level, circuits within the device may fail to function properly and may even be destroyed.

A conventional multi-phase switching regulator is an electric power conversion device that interfaces between a power supply and a device, providing current to the device and responding to changes in current demands to maintain a supply voltage level. However, a conventional multi-phase switching regulator relies on a large inductor for voltage conversion and the large inductor limits the ability of the conventional multi-phase switching regulator to quickly respond to dramatic changes in current demands (i.e., current transients). A typical 30 A phase of the conventional multi-phase switching regulator may use a 0.5 µH inductor for voltage conversion. The current response is limited to $di/dt=V/L$ which for V=11V (dropping a 12V input to a 1V supply voltage level) and L-0.5 µH gives 22 A/µs. Increasing the current provided to a device by 10 A in would require at least 500 ns. Additionally, synchronization of the pulse width modulation switching operation may increase the current response time of the conventional multi-phase switching regulator by several microseconds. When a clock period of the device is less than the current response time, the device may fail to function properly. A 500 MHz clock has a period of 2 ns, so hundreds of clock periods may occur during a 500 ns current response time.

Thus, there is a need for improving regulation of voltage levels and/or other issues associated with the prior art.

SUMMARY

A system and method are provided for sensing current. A current source is configured to generate a current and a pulsed sense enable signal is generated. A sense voltage across a resistive sense mechanism is sampled according to the sense enable signal, where the sense voltage represents a measurement of the current. A system includes the current source and a current sensing unit. The current source is configured to generate a current. The current sensing unit is coupled the current source and is configured to generate a pulsed sense enable signal and sample the sense voltage across a resistive sense mechanism according to the pulsed sense enable signal.

DETAILED DESCRIPTION

An electric power conversion device provides a desired output voltage level to a load, such as a device. The electric power conversion device converts power received from a power source (e.g., battery or main power supply) to a supply voltage level that is provided to the load. An inductor is used to deliver additional current to the load and regulate the output voltage level with switching mechanisms modulating the average current that flows through the inductor. A capacitor is coupled between the load and ground to store any excess current (difference between the current provided through the inductor and the current delivered to the load).

Figure 1A:
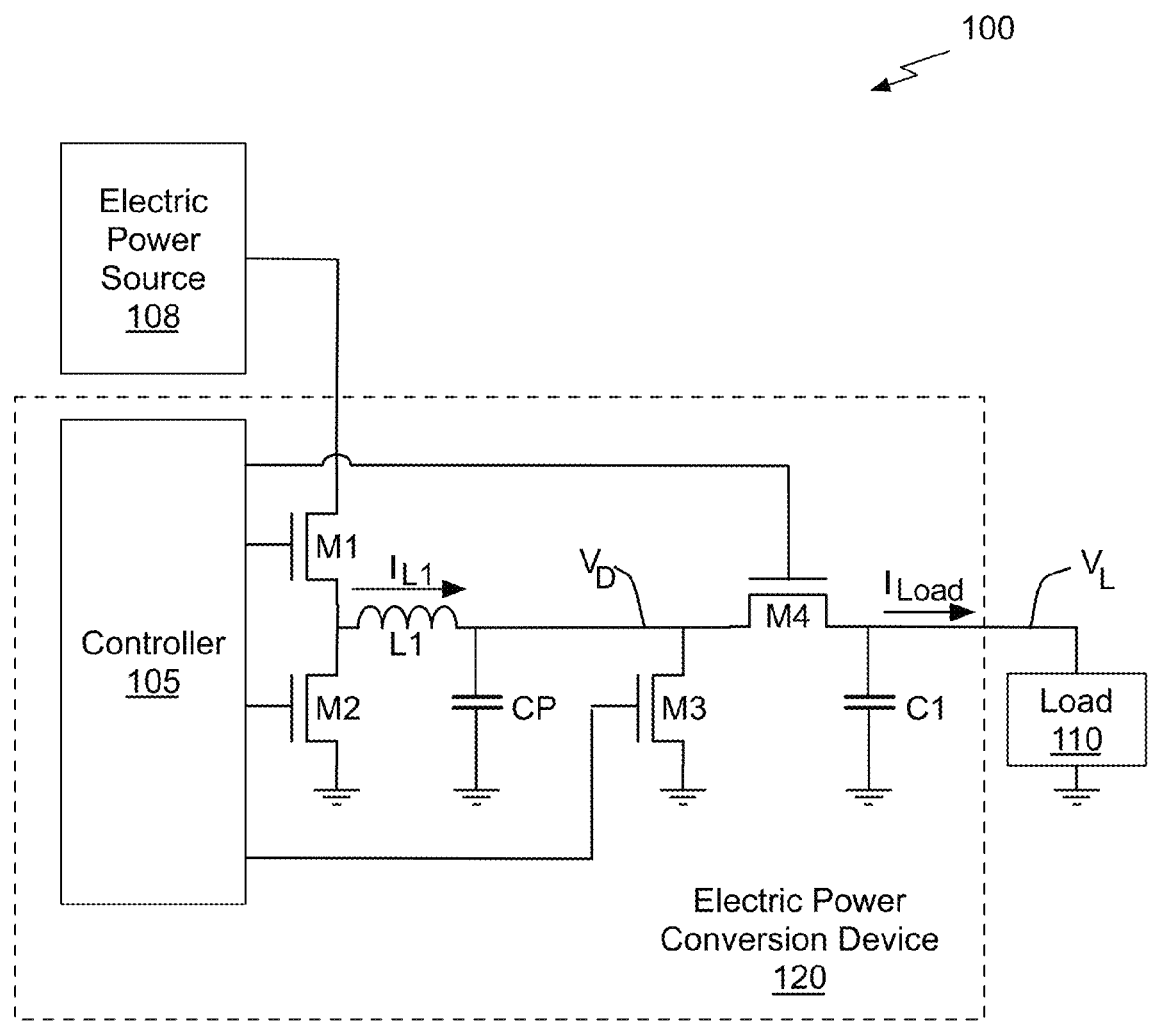
FIG. 1A illustrates an electric power conversion system including an electric power conversion device that is implemented as a current-parking switching regulator with a single inductor, in accordance with one embodiment.
Figure 1B:
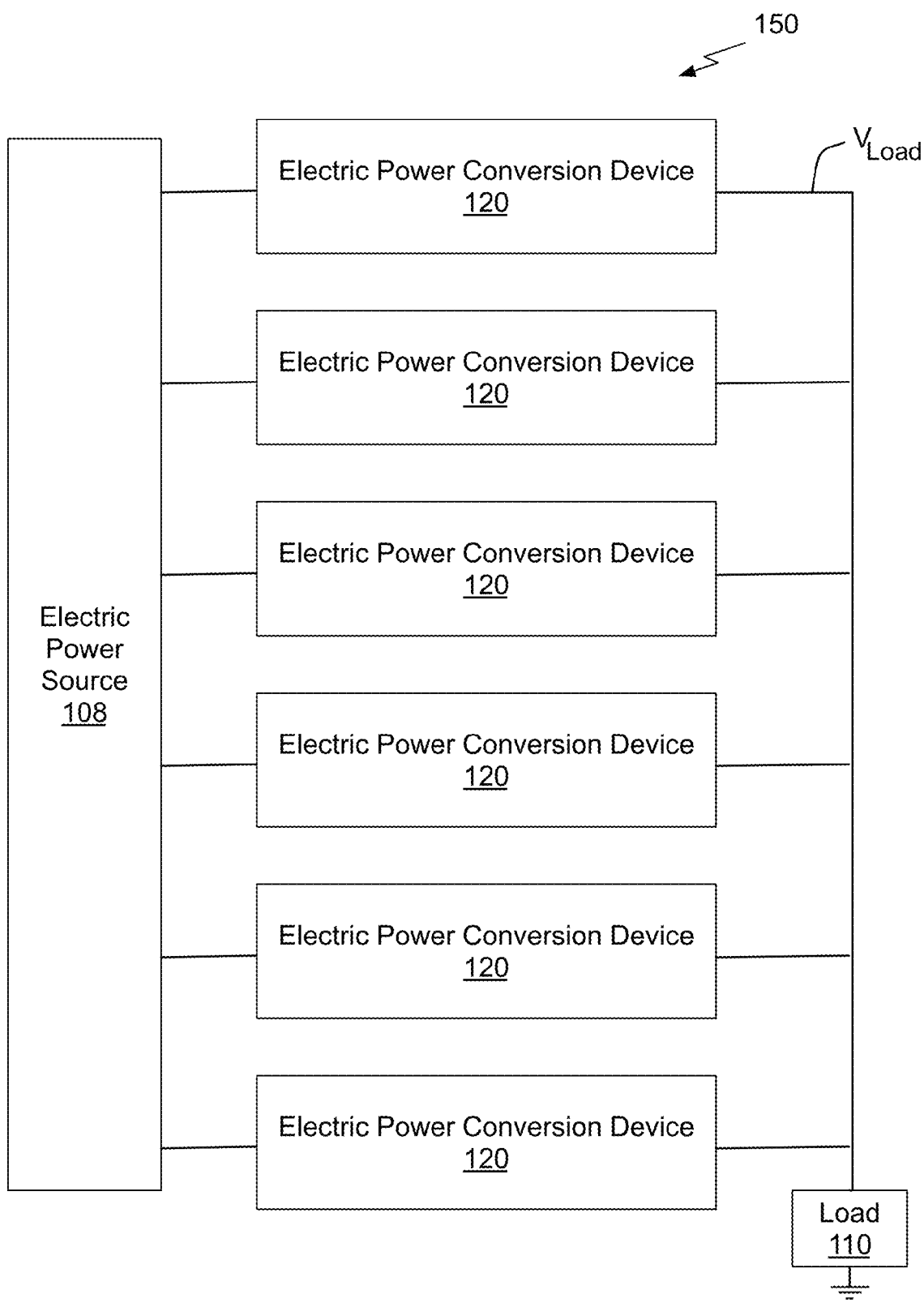
FIG. 1B illustrates a multi-phase switching regulator that includes multiple electric power conversion devices, in accordance with one embodiment.

FIG. 1A illustrates an electric power conversion system 100 including an electric power conversion device 120 that is implemented as a current-parking switching regulator with a single inductor L1, in accordance with one embodiment. The electric power conversion device 120 may be one phase of a multi-phase switching regulator, as shown in FIG. 1B. The electric power conversion device 120 is configured to provide a desired output voltage level ($V_L$) at the load 110 by converting power received from an electric power source 108. The electric power conversion device 120 includes a current control mechanism and a voltage control mechanism. The current control mechanism is coupled to the electric power source 108 and the controller 105 and is operable to control the average of the current $I_{L1}$ flowing through the inductor L1 and ensure a minimum current is provided across the multiple phases of a multi-phase switching regulator. For example, as illustrated, the current control mechanism may include one or more first switching mechanisms M1 and one or more second switching mechanisms M2. The switching mechanisms M1 and M2 may each include, for example, N-type power MOSFETs (metal oxide semiconductor field-effect transistor), and/or other switching mechanisms. Although single switching mechanisms M1 and M2 is illustrated for the ease of understanding, it will be appreciated that a plurality of switching mechanisms M1 and M2 may be connected in parallel to increase current capacity, decrease conduction losses, and the like.

The controller 105 is configured to apply one or more control signals to the switching mechanisms M1 and M2. For example, the controller 105 may be configured to generate pulse width modulation (PWM) signals or pulse frequency modulation (PFM) signals, a combination of PWM and PFM, and/or different control signals to selectively enable the switching mechanisms M1 and M2 according to a duty factor. Regardless of the specific configuration, the controller 105 is configured to provide control signals such that the switching mechanisms M1 and M2 are not concurrently enabled (i.e., turned on). In other words, only one of switching mechanism M1 and M2 is enabled at a time. Enabling switching mechanisms M1 and M2 concurrently provides a direct path between the supply of electric power source 108 and ground, thereby potentially damaging the electric power conversion device 120 and/or the load 110 and/or resulting in undesirable high power usage.

In contrast with conventional electric power conversion devices, the electric power conversion device 120 includes the voltage control mechanism in addition to the current control mechanism. The voltage control mechanism is coupled between the current control mechanism (at the downstream end of the inductor L1) and the load 110 and is operable to control the $V_L$. The current control mechanism is configured to generate current $I_{L1}$ that is "parked" in the inductor L1. The voltage control mechanism is operable to control the amount of the inductor current $I_{L1}$ that is delivered to a capacitor C1. As such, the voltage control mechanism comprises one or more switching mechanisms M3 and one or more switching mechanisms M4. The switching mechanisms M3 and M4 may each include, for example, N-type planar MOSFETs (metal oxide semiconductor field-effect transistor), and/or other switching mechanisms. Although single switching mechanisms M3 and M4 are illustrated for the ease of understanding, it will be appreciated that a plurality of switching mechanisms M3 and M4 may be connected in parallel to increase current capacity, decrease conduction losses, and the like.

A conventional electric power conversion device does not include the switching mechanisms M3 and M4, so the inductor L1 would instead be coupled directly to the capacitor C1 and the load 110. Any excess current that flows through the inductor L1 and is not consumed by the load 110 is accumulated on the capacitor C1 and any current drawn by the load 110 that exceeds the current provided by the inductor L1 is sourced by the capacitor C1. The inductor L1 resists changes in current, thereby preventing the stored energy in the inductor L1 from being released all at once to the load 110 when the current demands of the load 110 increase. This property of inductors, along with the storage capacity of the capacitor C1 enable $V_L$ to be sufficiently stable during steady-state operation (i.e., when the current demand of the load 110 is relatively constant). Nonetheless, there is some "ripple" in $V_L$ that depends on the size of the inductor L1, the size of the capacitor C1, and/or the switching frequency of the controller 105, among other factors. Generally speaking, as the size of the inductor L1 increases, the output ripple during steady state operation (i.e., approximately constant current demand at the load 110) proportionally decreases. Accordingly, the inductor L1 may be sized large enough in order to provide a $V_L$ that does not fluctuate outside a desired supply voltage range for the load 110. However, as previously explained, a conventional electric power conversion device is typically unable to respond to changes in the current needs of the load 110 quickly enough. The large inductance of L1 that is needed to reduce the ripple at $V_L$ increases the response time, producing larger voltage deviations when the current demand of the load 110 varies. The voltage control mechanism that is included in the electric power conversion device 120 enables faster response time to changes in current demand of the load 110 without necessitating decreasing the size of the inductor L1 which may cause the voltage ripple at $V_L$ to increase.

In contrast to the switching mechanisms M1 and M2, the voltage across the switching mechanisms M3 and M4 may be substantially less than the voltage drop across the inductor L1. For example, the voltage supplied at the downstream of the inductor L1 may be substantially equivalent to the output voltage at the load 110. Because the switching mechanisms M3 and M4 are switching a lower voltage, the switching mechanisms M3 and M4 may be constructed from lower-voltage devices, such as "planar" MOS transistors, as compared to the switching mechanisms M1 and M2. Lower-voltage devices can typically be switched at higher frequencies compared with higher-voltage devices, such as power MOSFETs. Therefore, power loss due to switching is reduced for the switching mechanisms M3 and M4 compared with the switching mechanisms M1 and M2. Hence switching mechanisms M3 and M4 can be switched at a substantially higher frequency than switching mechanisms M1 and M2.

Switching mechanisms M3 and M4 may be incorporated into an integrated circuit, thereby potentially reducing space used and/or reducing cost compared with using discrete components. For example, the switching mechanisms M3 and M4 may be realized on the same integrated circuit as the load 110, may be integrated on a separate die on the same package as the load 110, or may be integrated on a separate package. The switching mechanisms M3 and M4 may be realized as standard-voltage "core" transistors in a typical digital integrated-circuit process, or the switching mechanisms M3 and M4 may be realized as higher-voltage thick-oxide input-output transistors in a typical integrated-circuit process. In a preferred embodiment, the switching mechanism M4 is a P-type planar MOSFET and the switching mechanism M3 is an N-type planar MOSFET. However, one of ordinary skill in the art will understand that either type of MOSFET may be used for either switching mechanism with appropriate gate-drive circuitry without departing from the scope of the present disclosure.

The controller 105 may be further configured to apply one or more control signals to the voltage control mechanism. For example, the controller 105 may be configured to provide control signals to the switching mechanisms M3 and M4. As with the control signals provided to the switching mechanisms M1 and M2, the control signals that are provided to the switching mechanisms M3 and M4 may utilize PWM, PFM, bang-bang control, and/or any other suitable control schema in order to selectively enable the switching mechanism M3 or the switching mechanism M4. In some embodiments the control signals coupled to the switching mechanisms M3 and M4 may be at least partially synchronous with the control signals coupled to the switching mechanisms M1 and M2. In other embodiments, the control signals coupled to the switching mechanisms M3 and M4 may be asynchronous with the control signals coupled to the switching mechanisms M1 and M2. Furthermore, the control signals coupled to the switching mechanisms M3 and M4 may be provided at a different frequency than the control signals that are coupled to the switching mechanisms M1 and M2.

Regardless of the specific configuration of the control signals that are coupled to the switching mechanisms M3 and M4, the controller 105 may be configured to selectively enable the switching mechanism M3 and disable the switching mechanism M4 to disable the flow of current $I_{L1}$ to the load 110. Specifically, by enabling the switching mechanism M3 and disabling the switching mechanism M4, the instantaneous inductor current $I_{L1}$ flowing through the inductor L1 is diverted through the switching mechanism M3 to ground instead of being delivered to the capacitor C1. Conversely, by enabling the switching mechanism M4 and disabling the switching mechanism M3, substantially all of the instantaneous inductor current $I_{L1}$ flowing through the inductor L1 (less transistor conduction losses, inductor winding resistance, and the like) is provided to the capacitor C1.

The controller 105 may use PWM or PFM to switch the voltage control mechanism or may use a bang-bang technique. In either case, the duty factor (DF) determines the portion of the inductor current $I_{L1}$ that on average is supplied to the capacitor C1. The duty factor may range from 0-100%, where 0% corresponds to the state where the switching mechanism M4 is disabled (i.e., turned off) and the switching mechanism M3 is enabled and a 100% corresponds to the state where the switching mechanism M4 is enabled and the switching mechanism M3 is disabled. Changing the duty factor thereby changes the charge/discharge timing of the capacitor C1—a higher duty factor increases the current flow to the capacitor C1 and the load 110.

The capacitor C1 smoothes the square wave supply current provided through the switching mechanism M4 to generate $I_{Load}$ that is provided to the load 110. The $I_{Load}$ is provided to the load 110 according to the duty factor and the inductor current $I_{L1}$, as follows: $I_{Load} = DF \times I_{L1}$. As with the switching mechanisms M1 and M2, control signals are provided to the switching mechanisms M3 and M4 such that the switching mechanisms M3 and M4 are not concurrently enabled to avoid providing a direct path between the load 110 and ground (i.e., a short circuit across the capacitor C1).

During steady-state operation, the switching mechanism M3 is disabled and the switching mechanism M4 is enabled, such that substantially all of the inductor current $I_{L1}$ is provided to the load 110 as $I_{Load}$. The switching mechanisms M1 and M2 are selectively enabled ("switched") in order to control the inductor current $I_{L1}$, thereby controlling $V_L$. In this manner, if the voltage provided to the load 110 ($V_L$) is constant, the current provided through the switching mechanism M4 is substantially equivalent to the inductor current $I_{L1}$.

In sum, the current control mechanism is configured to generate current $I_{L1}$ that is parked in the inductor L1 and metered out to the load 110 by the voltage control mechanism. Because the voltage levels applied to the switching mechanisms M3 and M4 are low (i.e., the supply voltage of the load 110), the switching mechanisms M3 and M4 may be implemented as fast, inexpensive planar transistors and can be operated at very high frequency (e.g., 300 MHz) allowing very rapid response to current transients at the load 110. When the current demand at the load 110 changes (i.e., not steady-state operation), the switching mechanisms M3 and M4 of the voltage control mechanism may be controlled to quickly respond to the change in current demand by increasing or decreasing the amount of the current $I_{L1}$ this is metered out to the load 110. In general, the switching frequency of the current control mechanism is slower than the switching frequency of the voltage control mechanism due to the different types of switching mechanisms that are used.

A lumped element CP in the electric power conversion device 120 represents the parasitic capacitance on the downstream side of the inductor L1. Each time the switching mechanisms M3 and M4 are switched, the parasitic capacitance CP is charged to the load voltage $V_L$ (when the switching mechanism M4 is enabled) and then discharged to ground (when the switching mechanism M3 is enabled). Thus, each switching cycle of the switching mechanisms M3 and M4 an energy $E_P$ of $$E_P = (CP)V_L^2$$

is dissipated by charging and discharging the parasitic capacitance CP.

In a typical embodiment of the electric power conversion device 120, the inductor L1 is a surface mount 0.5 uH 30 A inductor, the switching mechanisms M3 and M4 are located on the package, and the capacitor C1 is on-chip and on-package bypass capacitance. Capacitor CP includes the capacitance of the vias, board traces, and package traces between the inductor L1 and the switching mechanisms M3 and M4. In a typical application the capacitance CP may total as much as 500 pF. If CP=500 pF and $V_L$=1V, then $E_P$ is 500 pJ. At a switching frequency of 300 MHz, 150 mW is dissipated charging and discharging CP. When the current control mechanism and the voltage control mechanism of the electric power conversion device 120 are configured as one of a plurality of phases of a regulator, $E_P$ is scaled by the number of phases for the total energy that is dissipated due to the cumulative parasitic capacitance.

This switching power increases as the switching frequency ($f_s$) of the switching mechanisms M3 and M4 is increased. One would like to switch the switching mechanisms M3 and M4 at a high frequency to minimize the required size of C1 that is given by $$C_1 = \frac{I_{L1}(1-DF)}{f_S V_R}$$

where DF is the duty factor of the switching mechanism M4 and $V_R$ is a ripple voltage of $V_L$.

For example with a phase current of 30 A, a frequency of 300 MHz, and a ripple voltage of 20 mV the required capacitance C1 is 5 uF per phase. C1 is typically distributed across many smaller capacitors on the package to give low series inductance and to provide a flat impedance as a function of the switching frequency. Increasing the switching frequency reduces the required size of C1 but at the expense of increased switching power $E_P$.

An advantage of a current-parking switching regulator, such as the electric power conversion device 120, is that C1 is the only filter capacitance needed. In comparison, a conventional electric power conversion device that does not include the switching mechanisms M3 and M4 relies on a large (hundreds of µF) filter capacitance to filter the low frequency (typically 300 kHz) ripple.

The configuration of the electric power source 108, the controller 105, the switching devices M1 and M2, and the inductor L1 shown in FIG. 1A is typically referred to as a "buck" converter. While the electric power conversion device 120 is described in the context of this buck converter, one of ordinary skill in the art will understand that the techniques described to regulate a voltage provided to the load 110 can be applied to other "switch-mode" power conversion circuits including, but not limited to, a forward converter, a half-bridge converter, a full-bridge converter, a flyback converter, and/or variants thereof.

FIG. 1B illustrates a multi-phase switching regulator 150 that includes electric power conversion devices 120, in accordance with one embodiment. Each of the electric power conversion devices 120 is one phase of a six-phase switching regulator. Each electric power conversion device 120 is configured to provide a desired output voltage level ($V_L$) at the load 110 by converting power received from an electric power source 108 for one phase of the six phases. A single controller may be used to control each of the electric power conversion devices 120 or each electric power conversion device 120 may include a dedicated controller 105 (as shown in FIG. 1B). A single filter capacitor C1 may be shared by the different electric power conversion devices 120 rather than including a filter capacitor C1 in each of the electric power conversion devices 120. Additionally, one or more of the electric power conversion devices 120 may be replaced with a current-parking switching regulator with a split inductor or a conventional electric power conversion device.

Figure 1C:
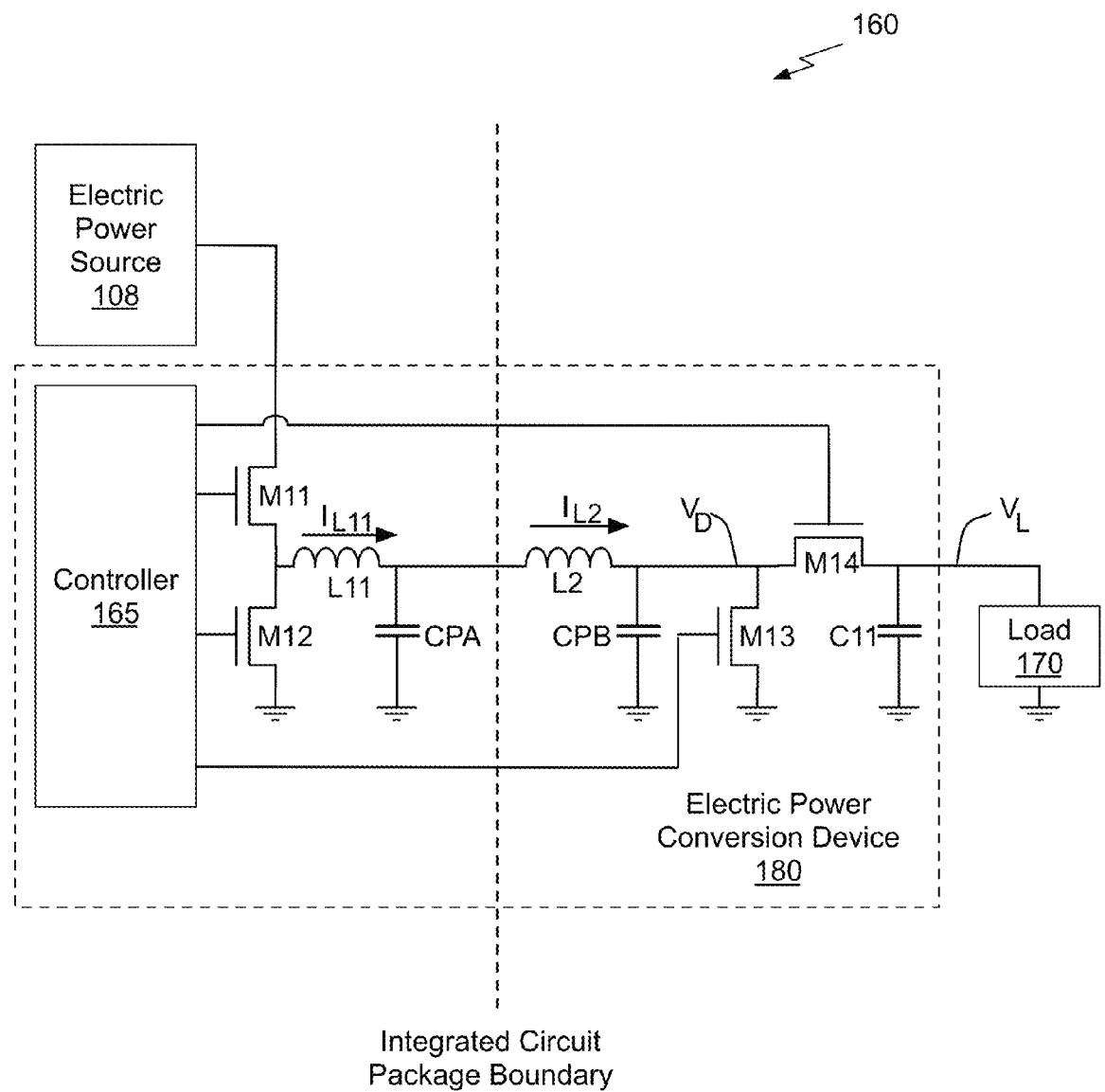
FIG. 1C illustrates a current-parking switching regulator with a split inductor, in accordance with one embodiment.

FIG. 1C illustrates an electric power conversion system 160 including an electric power conversion device 180 that is implemented as a current-parking switching regulator with a split inductor, in accordance with one embodiment. Compared with the electric power conversion device 120 shown in FIG. 1A, the electric power conversion device 180 includes a first inductor L11 that is coupled in series with a second inductor L2 to form a split inductor. Splitting the inductor reduces losses due to parasitic capacitance CPA on the downstream side of the first inductor L11.

The electric power conversion device 180 may be one phase of a multi-phase switching regulator. The electric power conversion device 180 is configured to provide a desired output voltage level ($V_L$) at the load 170 by converting power received from an electric power source 108. The electric power conversion device 180 includes a current control mechanism and a voltage control mechanism. The current control mechanism is coupled to the electric power source 108 and the controller 165 may be configured to generate control signals in the same manner as the controller 105 and is operable to control the average of the current $I_{L11}$ flowing through the inductor L11 and the current $I_{L2}$ flowing through the inductor L2. For example, as illustrated, the switching mechanisms M11 and M12 are configured and operable in the same manner as previously described switching mechanisms M1 and M2, respectively. Similarly, the switching mechanisms M13 and M14 are configured and operable in the same manner as previously described switching mechanisms M3 and M4, respectively. The capacitor C11 performs substantially the same function as the capacitor C1.

Using two different inductors L11 and L2 to form a split inductor reduces the switching energy so that the bulk of the parasitic capacitance falls between the inductor L11 and L2, shown as a first parasitic capacitance CPA. In one embodiment, L11 is a 0.5 µH 30 A first inductor on a printed circuit board (e.g., a discrete component) and the second inductor L2 is a 1 nH inductor in the package that encloses the load 170. The first parasitic capacitance CPA includes the capacitance of the vias, board traces, and package traces between the first inductor L11 and the second inductor L2. The first parasitic capacitance CPA may be approximately 490 pF. The second parasitic capacitance CPB consists primarily of the drain capacitance of the switching mechanisms M13 and M14 and may be approximately 10 pF. If CPB=10 pF and $V_L$=1V, then $E_P$ is 10 pJ and, at a switching frequency of 500 MHz, 5 mW is dissipated charging and discharging CPB.

The switching frequency of 500 MHz, allows use of a 0.5 µF capacitor (implemented as a distributed array of smaller capacitors in some embodiments) for the capacitor C11. The 1 nH inductance of the second inductor L2 can be formed by integrating a ferrite bead around the traces or bumps carrying the current $I_{L2}$ or by simply running a trace a suitable distance from the ground return (making the second inductor L2 a planar air-core inductor). The resonant frequency of the tank circuit formed by L2 and the first parasitic capacitance CPA is $f_r$=230 MHz. Thus, as long as the switching frequency of the switching mechanisms M13 and M14 is high compared to $f_r$, the capacitance of the first parasitic capacitance CPA is effectively isolated from the switching node $V_L$. Because the first parasitic capacitance CPA is located between the first inductor L11 and the second inductor L2, CPA is isolated and is lossless. Any excess current is stored in the split inductor formed by the first inductor L11 and the second inductor L2.

Pulsed Current Sampling

The controller 155 shown in FIG. 1A may be configured to regulate the current control mechanism based on the amount of current $I_{L1}$ that is generated. Therefore, a current sensing unit may be configured to sample the current $I_{L1}$ and provide an input to the controller 105. The current sensing unit includes a resistive sense mechanism that is coupled to the downstream end of the inductor L1 to sample $V_D$. The level of $V_D$ corresponds to the current $I_{L1}$. The current sensing unit may provide samples of $V_D$ to the controller 105. Similarly, a current sensing unit that includes a resistive sense mechanism coupled to the downstream end of the inductor L2 shown in FIG. 1C may provide samples of $V_D$ to the controller 165.

Figure 2:
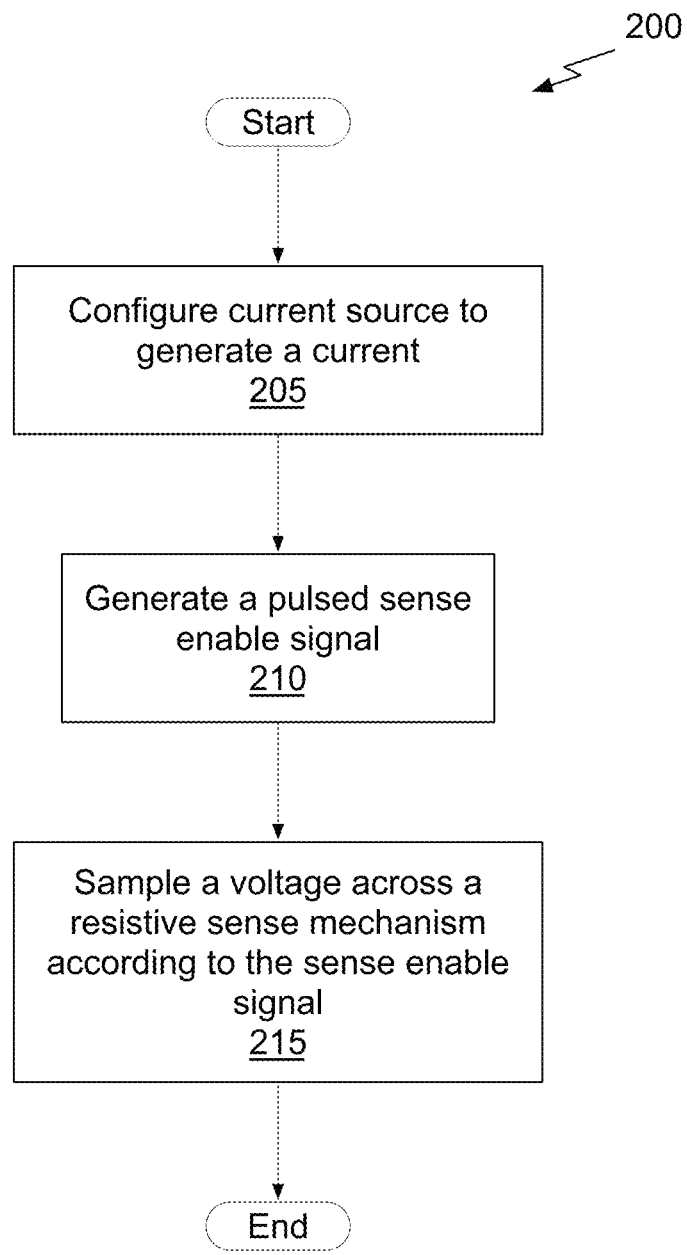
FIG. 2 illustrates a flowchart of a method for pulsed sampling of the current provided to a load, in accordance with one embodiment.

FIG. 2 illustrates a flowchart 200 of a method for pulsed sampling of the current provided to the load 110 or 170, in accordance with one embodiment. At step 205, a current source is configured to generate a current $I_{L1}$ or $I_{L2}$. At step 210, a pulsed sense enable signal is generated. At step 215, a voltage across a resistive sense mechanism is sampled according to the sense enable signal. The voltage corresponds to the current $I_{L1}$ or $I_{L2}$.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Conventional current sensing techniques sample a voltage corresponding to the current continuously. Power is consumed during the continuous sampling. Current is typically measured by measuring the voltage across a sense resistor. If a phase of a switching regulator can carry a current i between 0 and 30 A and a 5 mOhm sense resistor is used the sense voltage VR will be between 0 and 150 mV. At peak current, the sense resistor will dissipate 4.5 W, causing a significant loss of efficiency and a large component may be needed to dissipate the heat that is generated.

The power dissipated in the sense resistor can be greatly reduced by not sensing the current continuously. Instead, the sense voltage that represents a measurement of the current may be sensed only when needed. During times when the voltage is not sensed, the sense resistor can be bypassed. More specifically, rather than continuously sampling a sense voltage to measure the current, a pulsed sense enable signal may be used to sample the sense voltage only during a pulse.

The pulses can ensure that the sense voltage (e.g., $V_D$) is sampled when the switching mechanism M1 is enabled (i.e., when current $I_{L1}$ is generated) or when the switching mechanism M1 is enabled and the switching mechanism M4 is disabled (i.e., when current $I_{L1}$ is generated and when a portion of the current $I_{L1}$ is not being provided to the load 110). The power consumption during the sampling is reduced for the pulsed sampling compared with continuous sampling. Additionally, the size of the resistive sense mechanism needed to perform pulsed sensing may be reduced compared with a circuit configured to perform continuous sampling.

Figure 3A:
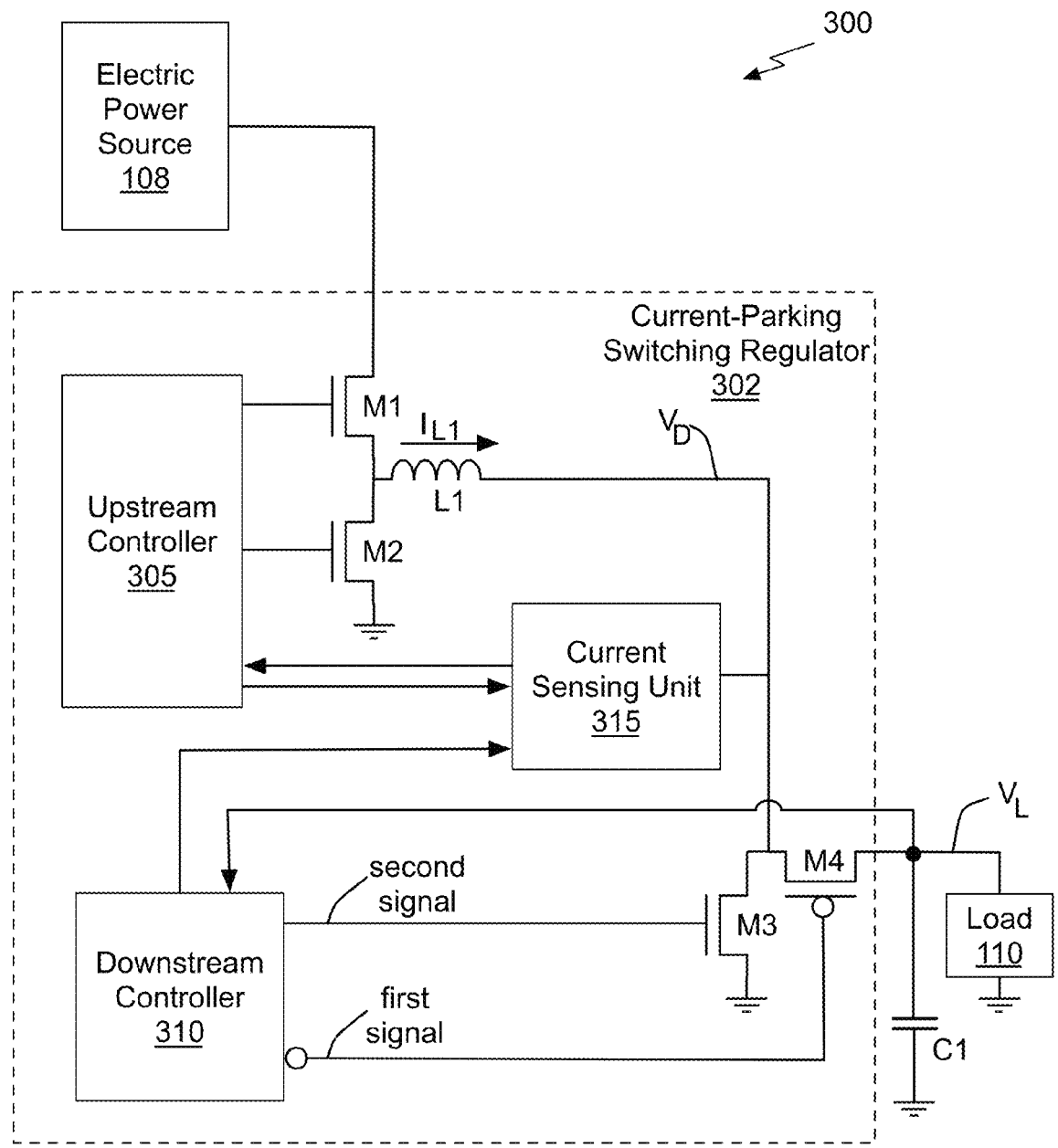
FIG. 3A illustrates a current-parking switching regulator, in accordance with one embodiment.

FIG. 3A illustrates a current-parking switching regulator 302, within an electric power conversion system 300, in accordance with one embodiment. Although a single inductor L1 is shown in FIG. 3A, a second inductor may be included as previously described in conjunction with FIG. 1C. The upstream controller 305 is configured to generate signals coupled to the gates of the switching mechanisms M1 and M2 that enable and disable the switching mechanisms M1 and M2. When the switching mechanism M1 is enabled, the current source (i.e., inductor L1) is coupled to the electric power source 108 and when the switching mechanism M2 is disabled the current source is decoupled or isolated from the current sink. When the switching mechanism M2 is enabled, the current source is coupled to the current sink and when the switching mechanism M1 is disabled the current source is decoupled or isolated from the electric power source 108. The upstream controller 305 enables and disables the switching mechanisms M1 and M2 to generate the current $I_{L1}$. In one embodiment, the upstream controller 305 is configured as a PWM controller.

The upstream controller 305 may be configured to perform current-mode control because the upstream controller 305 regulates the sum of the phase currents rather than a downstream voltage level when multiple voltage control mechanisms are configured to operate at different phases to regulate $V_L$, as described in conjunction with FIG. 1B. The upstream controller 305 may be configured to regulate absolute inductor current, $I_{L1}$ by controlling the generation of $I_{L1}$ based on sensing the current $I_{L1}$ at the downstream side of the inductor L1.

A current sensing unit 315 is coupled to the downstream side of the inductor L1 and receives input signals from the upstream controller 305 and the downstream controller 310. The input signals indicate when the switching mechanism M1 is enabled and when the switching mechanism M4 is disabled. The input signals may also indicate when the switching mechanism M3 will be enabled. The current sensing unit 315 senses the current $I_{L1}$ by sensing the voltage level at $V_D$ across a resistive mechanism, as described in detail in conjunction with FIGS. 3D and 3E. The level of the sense voltage represents a measurement of the current and is provided to the upstream controller 305. The upstream controller 305 uses the sensed voltage level to generate the signals that enable and disable the switching mechanisms M1 and M2 to generate the current $I_{L1}$.

Figure 3B:
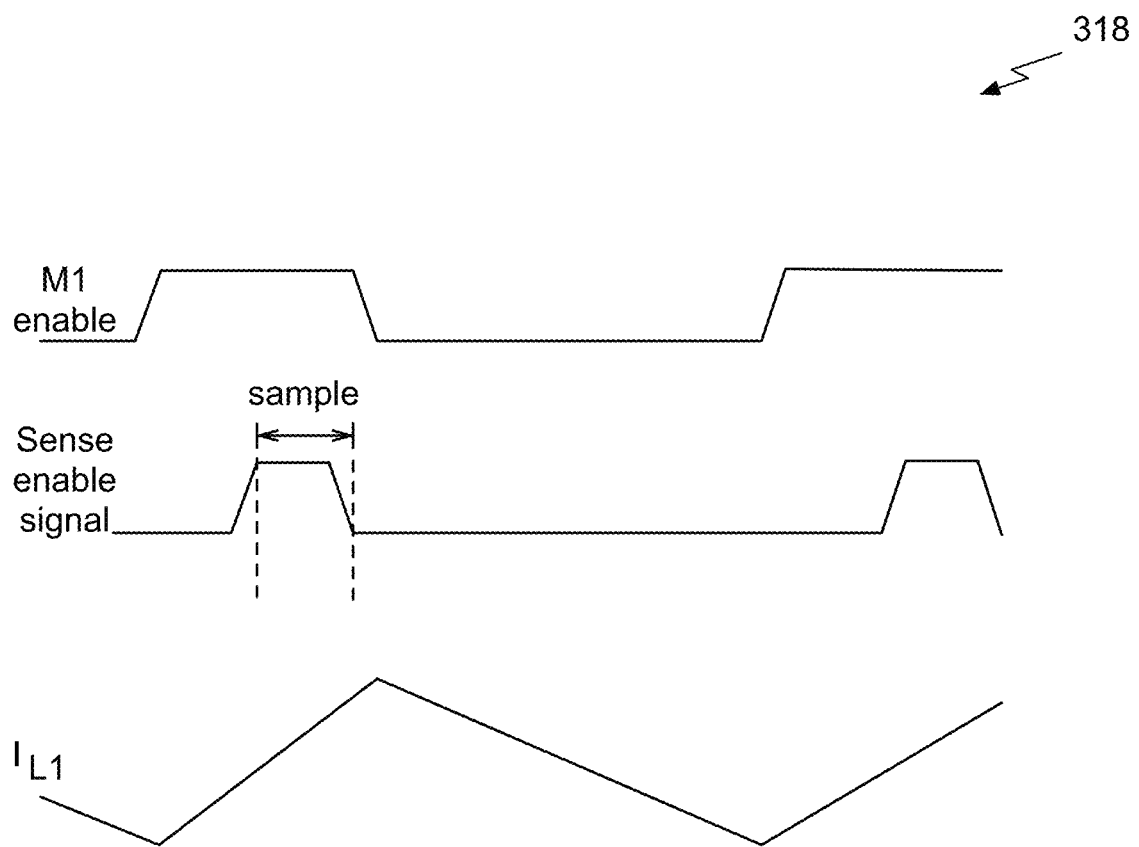
FIG. 3B illustrates waveforms controlling the generation and sampling of current that is provided to the load of the current-parking switching regulator shown in FIG. 3A, in accordance with one embodiment.

FIG. 3B illustrates waveforms 318 that control the generation and sampling of the current $I_{L1}$, in accordance with one embodiment. A first signal that is generated by the upstream controller 305 enables/disables the switching mechanism M1 (i.e., drives the gate of an NMOS transistor). The sense enable signal that is generated within the current sensing unit 315 may pulse to sample a voltage at a time when the switching mechanism M1 is enabled. The current $I_{L1}$ increases while the switching mechanism M1 is enabled and decreases while the switching mechanism M1 is disabled.

The upstream control 305 may be configured as a PWM controller that enables the switching mechanism M1 when an oscillator generates a rising edge and disables the switching mechanism M1 when the voltage sensed by the current sensing unit 315 reaches a threshold. Current sensing is only needed when the switching mechanism M1 is enabled (typically 250 ns of a 3 us PWM cycle) and only near the end of the time when the switching mechanism M1 is enabled. Therefore, in one embodiment, the resistive sense mechanism within the current sensing unit 315 can be bypassed for all but 100 ns of a 3 us PWM cycle, reducing the power dissipation by a factor of 30 in power dissipation, from 4.5 W to 150 mW compared with continuous sampling.

Power can be reduced further by observing that the sensing bandwidth is much higher than required. A digital controller operating at 200 MHz, for example, needs a current sample only once every 5 ns. If a sample can be acquired in 500 ps, the resistive sense mechanism within the current sensing unit 315 can be operated by asserting the sense enable signal with a duty factor of 10% even when the switching mechanism M1 is enabled, reducing sensing power further to 15 mW.

In addition to pulsing the sense enable signal when the switching mechanism M1 is enabled, The current sensing unit 315 may also be configured to pulse the sense enable signal based on the first signal and the second signal that are generated by the downstream controller 310.

Referring back to FIG. 3A, in one embodiment, the downstream controller 310 is a bang-bang control circuit that is configured to hold the voltage level at the load 110, $V_L$, within a specified voltage range between a minimum voltage level (Vmin) and a maximum voltage level (Vmax). For example, when the nominal voltage level of $V_L$ is 1 volt and a 20 mV ripple is specified, Vmin is specified as 0.99V and Vmax is specified as 1.01V.

The downstream controller 310 is configured to generate signals coupled to the gates of the switching mechanisms M3 and M4 that enable and disable the switching mechanisms M3 and M4. When the switching mechanism M3 is enabled, the current source (i.e., inductor L1) is coupled to the current sink (i.e., ground) and when the switching mechanism M3 is disabled the current source is decoupled or isolated from the current sink. When the switching mechanism M4 is enabled, the current source is coupled to the load 110 and when the switching mechanism M4 is disabled the current source is decoupled or isolated from the load 110.

As shown in FIG. 3A, in one embodiment the switching mechanism M3 is a N-type planar MOS transistor and the switching mechanism M4 is a P-type planar MOS transistor. The signals generated by the downstream controller 310 are configured to prevent overlap current and overvoltage on the drains of the switching mechanisms M3 and M4. Specifically, only one of the switching mechanisms M3 and M4 is enabled at a time.

The switching mechanism M3 is disabled before the switching mechanism M4 is enabled to ensure a "dead-time" when both switching mechanisms M3 and M4 are disabled. The parasitic capacitance of the drains of the switching mechanisms M3 and M4 is charged by the current $I_{L1}$ during the dead-time and the switching mechanism M4 is enabled when the voltage across the parasitic capacitance reaches $V_L$, so that current does not flow from the load 110 to the inductor L1. The dead-time between when the switching mechanism M3 is disabled and the switching mechanism M4 is enabled is controlled to allow the inductor L1 to charge the drain of the switching mechanism M4 to $V_L$ before the switching mechanism M4 is enabled. The dead-time also ensures that switching mechanism M3 is disabled when the switching mechanism M4 is enabled to avoid shoot-through current from the load 110 through the switching mechanisms M4 and M3 to ground.

Similarly the dead-time between when the switching mechanism M4 is disabled and the switching mechanism M3 is enabled is controlled to keep the drain of the switching mechanism M4 from being charged too high by $I_{L1}$ before the switching mechanism M3 is enabled. The dead-time between when the switching mechanism M4 is disabled and the switching mechanism M3 is enabled also ensures that switching mechanism M4 is disabled when the switching mechanism M3 is enabled to avoid shoot-through current from the load 110 through the switching mechanisms M4 and M3 to ground.

Figure 3C:
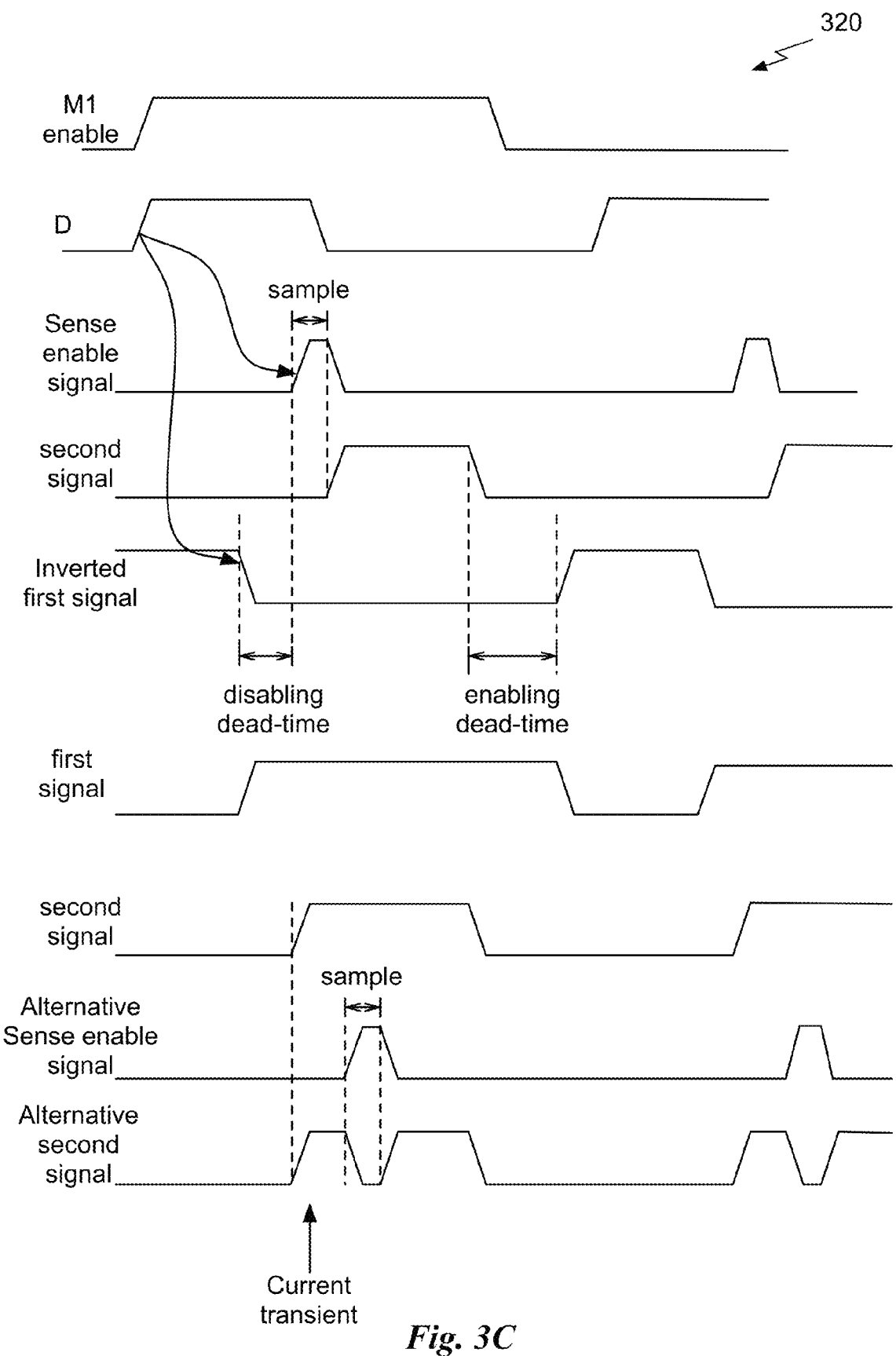
FIG. 3C illustrates waveforms controlling the generation and sampling of current and signals that regulate the voltage level at the load of the current-parking switching regulator shown in FIG. 3A, in accordance with one embodiment.

FIG. 3C illustrates waveforms 320 controlling the generation and sampling of the current $I_{L1}$ and the first and the second signals that regulate the voltage level at the load 110 of the current-parking switching regulator shown in FIG. 3A, in accordance with one embodiment. The M1 enable signal is generated by the upstream controller 305 enables/disables the switching mechanism M1. The signal D is generated by the downstream controller 310 to control the operation of the voltage control mechanism and the duty factor of signal D is the duty factor of the downstream controller 310. Specifically, the signal D controls the portion of current that is provided to the load 110 and therefore, corresponds to the fraction of the current $I_{L1}$ that is consumed by the load 110. The signal D is used to generate a first signal and a second signal.

The first signal that is output by the downstream controller 310 controls (i.e., enables and disables) the switching mechanism M4 and the second signal controls the switching mechanism M3. When the switching mechanism M4 is a P-type MOS transistor, an inverted version of the first signal is coupled to the gate of the P-type MOS transistor. For the purposes of understanding the waveforms 315 shown in FIG. 3C, the inverted first signal is shown. When the inverted version of the first signal is high the switching mechanism M4 is enabled and when the inverted version of the first signal is low, the switching mechanism M4 is disabled. Similarly, when the second signal is high the switching mechanism M3 is enabled and when the second signal is low, the switching mechanism M3 is disabled.

Separate delays may be used for a first signal that enables the switching mechanism M3 and a second signal that enables the switching mechanism M4. Furthermore, a different delay may be used for a rising transition than is used for a falling transition of the first and/or the second signal. The delays control the duration of the dead-times when both switching mechanisms M3 and M4 are disabled (i.e., when the inverted first signal and the second signal are negated) and the current source is decoupled from the load and decoupled from the current sink. The duration of an "enabling" dead-time between when the switching mechanism M3 is disabled and the switching mechanism M4 is enabled may differ from the duration of a "disabling" dead-time between when the switching mechanism M4 is disabled and the switching mechanism M3 is enabled.

The "disabling" dead-time occurs between when the switching mechanism M4 is disabled by the first signal and the sense enable signal is asserted and/or the switching mechanism M3 is enabled by the second signal. The "enabling" dead-time occurs between when the switching mechanism M3 is disabled by the second signal and the switching mechanism M4 is enabled by the first signal. During the disabling and the enabling dead-times the switching mechanisms M3 and M4 are disabled (i.e., when the inverted first signal and the second signal are negated). Therefore, the current source is decoupled from both the current sink and the load. The enabling dead-time may be longer than the disabling dead-time to charge the parasitic capacitance at the drains of the switching mechanisms M3 and M4 between the current source and the voltage control mechanism by the current $I_{L1}$. When the switching mechanism M4 is an N-type MOS transistor, an inverted version of the first signal is coupled to the gate of the switching mechanism M4.

The sense enable signal that is generated within the current sensing unit 315 may pulse to sample a voltage at a time when the switching mechanism M1 is enabled, the switching mechanism M4 is disabled, and before the switching mechanism M3 is enabled (i.e., when the M1 enable and the first signal are both asserted and the second signal is negated). Pulsing the sense enable signal terminates the disabling dead-time because the current sensing unit 315 diverts the current to through the resistive sense mechanism to the current sink to sample the voltage. In another embodiment, the sense enable signal that is generated within the current sensing unit 315 may pulse to sample a voltage at a time when the switching mechanism M1 is enabled, the switching mechanism M4 is disabled, and after the switching mechanism M3 has been enabled, as shown in FIG. 3C by the alternative sense enable and alternative second signals. Delaying the pulse to sample the voltage after the switching mechanism M3 is enabled avoids any current transient that occurs when the switching mechanism M3 is first enabled so that the voltage that is sampled during the pulse of the alternative sense enable more accurately reflects the current $I_{L1}$. In one embodiment, as shown by the alternative second signal, the switching mechanism M3 is disabled during the pulse to direct the current through the resistive sensing mechanism. The alternative second signal may be produced as the logical AND of the inverted alternative sense enable signal and the second signal.

The sense enable signal may remain asserted after the voltage is sampled and until the second signal is negated. Alternatively, the sense enable signal may be asserted when the voltage is sampled and be negated as the second signal is asserted. In some cases, such as when the current demand of the load 110 is high, the downstream controller 310 may not disable the switching mechanism M4 often enough so that the sense enable signal can pulse as frequently as needed to provide samples to the upstream controller 305. Therefore, the downstream controller 310 may be configured to disable the switching mechanism M4 periodically for just long enough for the sense enable signal to pulse and sample the voltage.

Figure 3D:
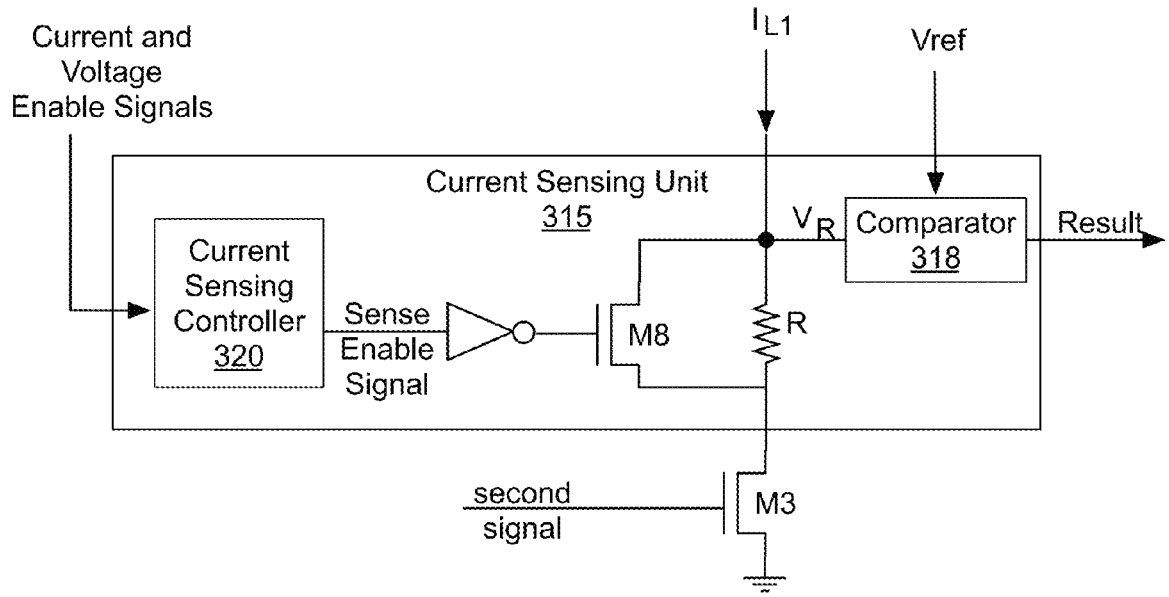
FIG. 3D illustrates a current sensing unit, in accordance with one embodiment.

FIG. 3D illustrates a current sensing unit 315, in accordance with one embodiment. The current sensing unit 315 receives inputs from the upstream controller 305 and the downstream controller 310 (e.g., current and voltage enable signals) that are used by a current sensing controller 320 to generate the sense enable signal. A resistor R operates as a resistive sense mechanism and is coupled in parallel with a bypass mechanism M8. The resistive sense mechanism and the bypass mechanism are coupled in series with the switching mechanism M3. In one embodiment, the bypass mechanism M8 is an NMOS transistor having lower resistance than the resistive sense mechanism. The bypass mechanism is enabled when the sense enable signal is not pulsed (i.e., when the sense enable signal is negated) and the switching mechanism M3 is enabled. When the sense enable signal is pulsed (and the switching mechanism M3 is enabled) the sense voltage $V_R$ is sampled and a comparator 318 compares $V_R$ with a reference voltage (Vref) to determine if the maximum current for a phase has been reached. The result of the comparison is a measurement of the current that is provided to the upstream controller 305.

The resistor R may be replaced with one or more transistors (that are always enabled) coupled in parallel with the bypass mechanism M8. The current sensing unit 315 may be used with a sense enable signal as shown in FIG. 3B. A current sensing structure comprising a resistive sense mechanism and a bypass mechanism, as shown in the current sensing unit 315 may be used to sample a sense voltage to provide a measurement of current. For example, the current sensing structure may be inserted between the switching mechanism M4 and the load 110 to sense the current consumed by the load 110. The bypass mechanism would be enabled when the sense enable signal is not pulsed to sample the sense voltage (i.e., when the sense enable signal is negated) and the sense voltage ($V_L$) would be sampled during a time when the switching mechanism M4 is enabled. Although, the current sensing structure is shown within the context of a voltage regulator, the current sensing structure may be used to sense current in other circuits. The sensing is performed in a non-continuous manner by sampling a sense voltage according to the sense enable signal, i.e., when a measurement of the current is needed.

Figure 3E:
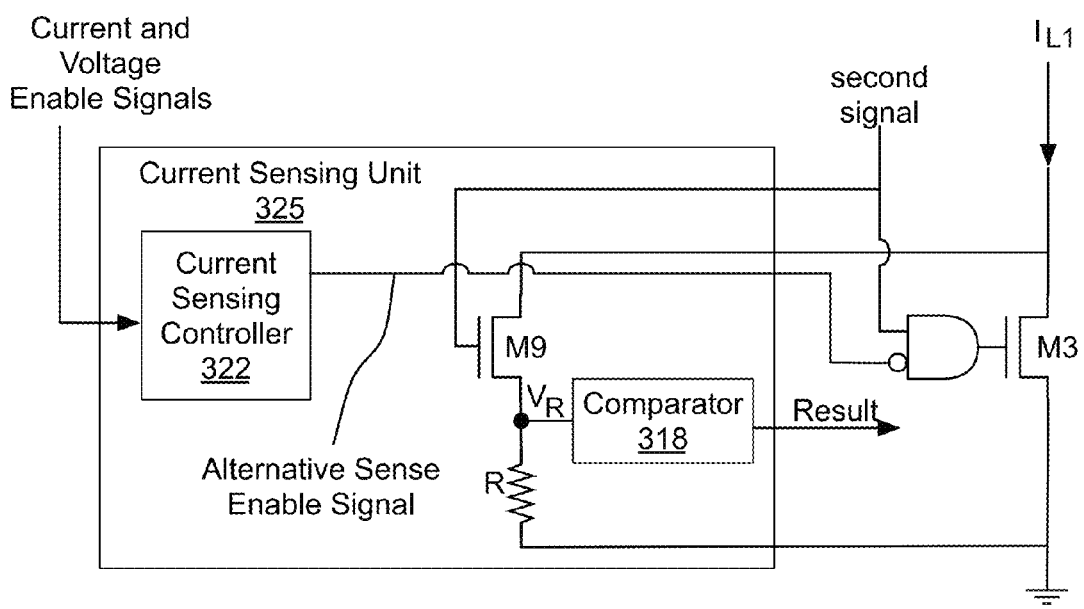
FIG. 3E illustrates another current sensing unit, in accordance with one embodiment.

FIG. 3E illustrates another current sensing unit 325, in accordance with one embodiment. The current sensing unit 325 may be used in place of the current sensing unit 315 in the current parking switching regulator 302 shown in FIG. 3A. The current sensing unit 325 receives inputs from the upstream controller 305 and the downstream controller 310 (e.g., current and voltage enable signals) that are used by a current sensing controller 322 to generate the sense enable signal. A switching mechanism M9 is controlled by the sense enable signal to direct current through a resistive sense mechanism (i.e., resistor R). The switching mechanism M9 and the resistive sense mechanism are coupled in parallel with the switching mechanism M3. In one embodiment, the switching mechanism M9 is the resistive sense mechanism and the resistor R is omitted. In yet another embodiment, the switching mechanism M9 and the resistor in series form the resistive sense mechanism. In these latter two embodiments $V_R$ is sensed at the upper terminal of the switching mechanism M9 that is coupled to the switching mechanism M3. The resistive sense mechanism has higher resistance than the switching mechanism M3 and $V_R$ is sampled across the resistive sense mechanism.

When the sense enable signal is pulsed the sense voltage $V_R$ is sampled and provided to the upstream controller 305. The sense enable signal may pulsed when the switching mechanism M4 is disabled and after the second signal is asserted, as shown in FIG. 3C as the alternative sense enable signal, to avoid measuring the current during a current transient that occurs just after the switching mechanism M3 is enabled. The switching mechanism M9 may be enabled using the second signal and the switching mechanism M3 may be enabled by a logical AND of the inverted alternative sense enable signal and the second signal (shown as the alternative second signal in FIG. 3C) so that all of the current is diverted through the resistive sensing mechanism during the pulse. The switching mechanism M9 may remain enabled after the pulse to assist the switching mechanism M3 in reducing the voltage $V_D$ after $V_R$ has been sampled.

In one embodiment, the sense enable signal is pulsed when the switching mechanism M4 is disabled and before the second signal is asserted to enable the switching mechanism M3 (as shown by the sense enable signal and the second signal in FIG. 3C). The switching mechanism M9 may be enabled by a logical-OR of the sense enable signal and the second signal, so that the switching mechanism M9 assists the switching mechanism M3 in reducing the voltage $V_D$ after $V_R$ has been sampled. In one embodiment, the second signal may be asserted 500 ps after a pulse of the sense enable signal to enable the switching mechanism M3.

Figure 3F:
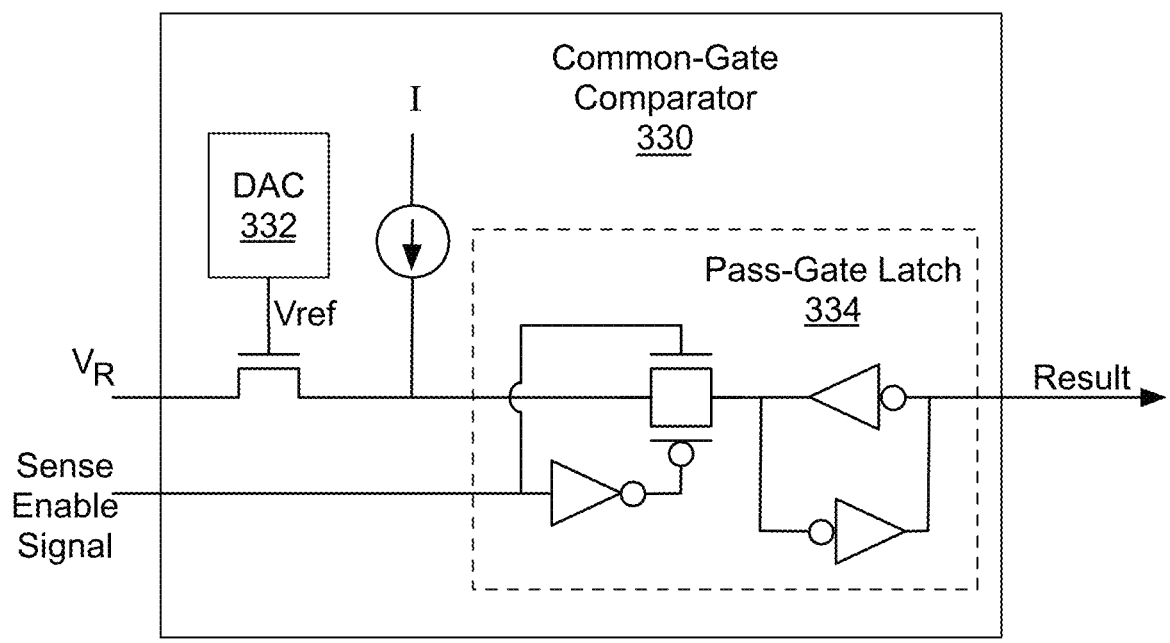
FIG. 3F illustrates a common-gate comparator, in accordance with one embodiment.

FIG. 3F illustrates a common-gate comparator 330, in accordance with one embodiment. The common-gate comparator 330 may be used in place of the comparator 318 shown in FIGS. 3D and 3E. The upstream controller 305 receives the result of a comparison between $V_R$ and Vref from the current sensing unit 315 or 325. In one embodiment, $V_R$ varies between 0 and 150 mV. The common-gate comparator 330 includes a DAC 332 that is configured to convert an analog signal to generate Vref that controls the gate of a pass transistor. The pass transistor receives $V_R$ and transmits $V_R$ to produce a comparison result indicating that $I_{L1}$ is greater than the maximum current for a phase when $V_R$ is greater than Vref−Vthreshold, where Vthreshold is the threshold voltage of the pass transistor. A pass-gate latch 334 captures the comparison result when the sense enable signal pulses to produce the result that is provided to the upstream controller 305.

When an actual current measurement—rather than just a comparison against a reference value—is required, the pass transistor and the DAC 332 can be operated as a successive-approximation A/D converter. For example, a 6-bit current measurement may be performed by operating the pass transistor and the DAC 332 six times in 3 ns to generate each bit of a current measurement.

Figure 4A:
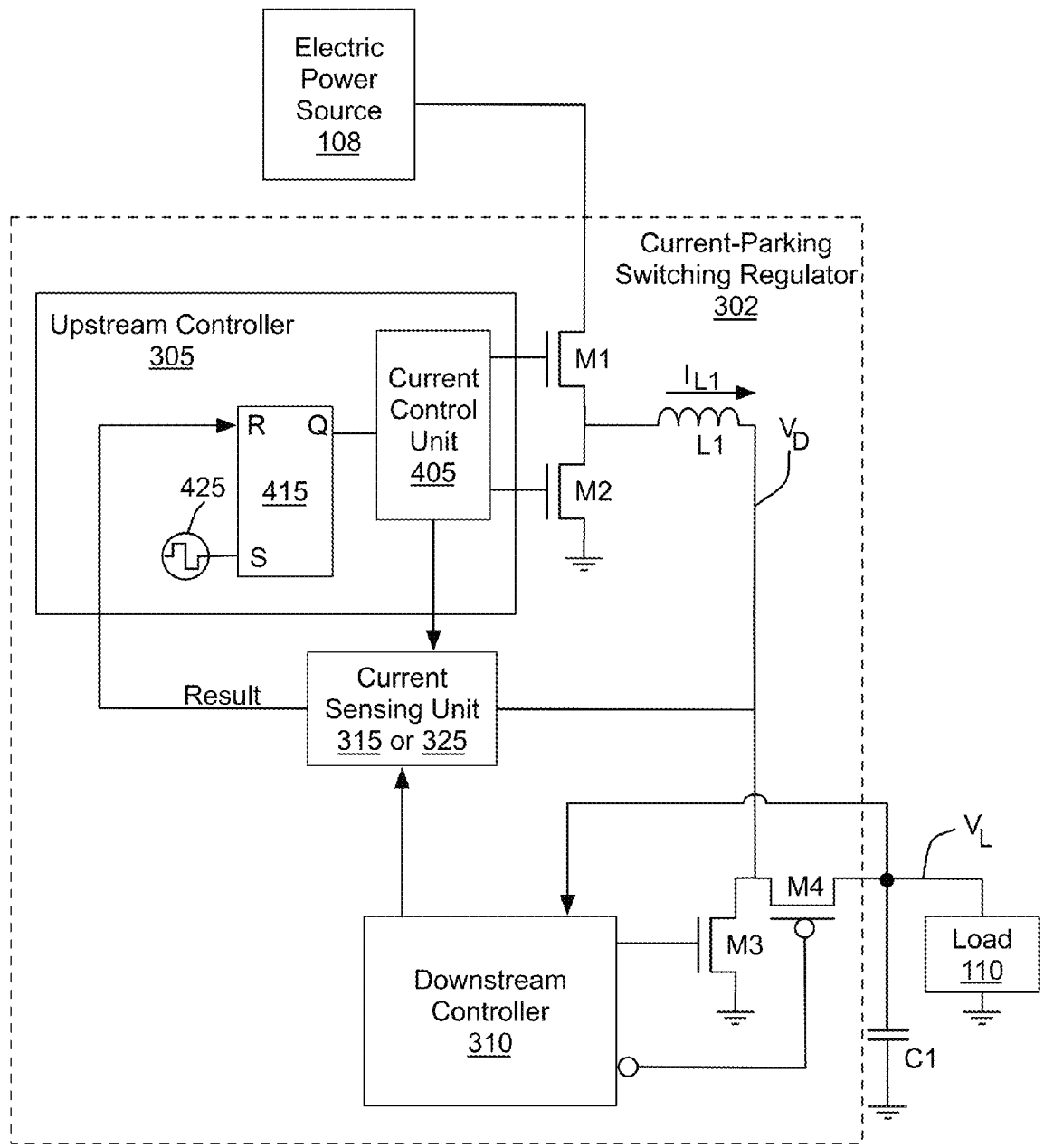
FIG. 4A illustrates an upstream controller of the current-parking switching regulator shown in FIG. 3A, in accordance with one embodiment.

FIG. 4A illustrates an upstream controller 305 of the current-parking switching regulator 302 shown in FIG. 3A, in accordance with one embodiment. The upstream controller 305 may be configured to provide a reserve amount of current $I_{L1}$ that is greater than the current that is consumed by the load 110. For example, a 20% reserve may be provided by maintaining $I_{L1}$ at a target current of 10 amps assuming that the current consumed by the load 110 is 8 amps. The reference voltage, Vref is set to a value corresponding to the target current. $V_R$ increases as $I_{L1}$ increases and $V_R$ decreases as $I_{L1}$ decreases. When $V_R$ is greater than Vref, the upstream controller 305 reduces $I_{L1}$. In one embodiment, Vref varies based on a processing workload associated with the load 110. For example, just before a heavy workload is initiated, the Vref is increased to increase the current.

A set-reset flip-flop 415 is set by an oscillator 425 at the PWM frequency (typically 300 kHz) and reset by the result generated by the current sensing unit 315 or 325 that indicates when the current $I_{L1}$ is greater than the maximum current for a phase. The Q output of the flip-flop 415 drives a current control unit 405 that generates enable signals for the switching mechanisms M1 and M2 of the current control mechanism. In one embodiment, the current control unit 405 is a half-bridge driver. The Q output is high when the R input is low and the output of the oscillator 425 is high. The Q output will remain high until the R input is high. The Q output is low whenever the R input is high (when $I_{L1}$ is less than the maximum current for a phase). The current control unit 405 enables the switching mechanism M1 and disables the switching mechanism M2 when Q is high to increase the current $I_{L1}$. The current control unit 405 disables the switching mechanism M1 and enables the switching mechanism M2 when Q is low to decrease the current $I_{L1}$. The enable signals generated by the current control unit 405 should be non-overlapping so that the output of the electric power source 108 is not shorted to ground. The enable signal provided to the switching mechanism M1 may be configured to implement a bootstrap power supply to generate a gate drive above the voltage at the electric power source 108 (e.g., 12V).

Figure 4B:
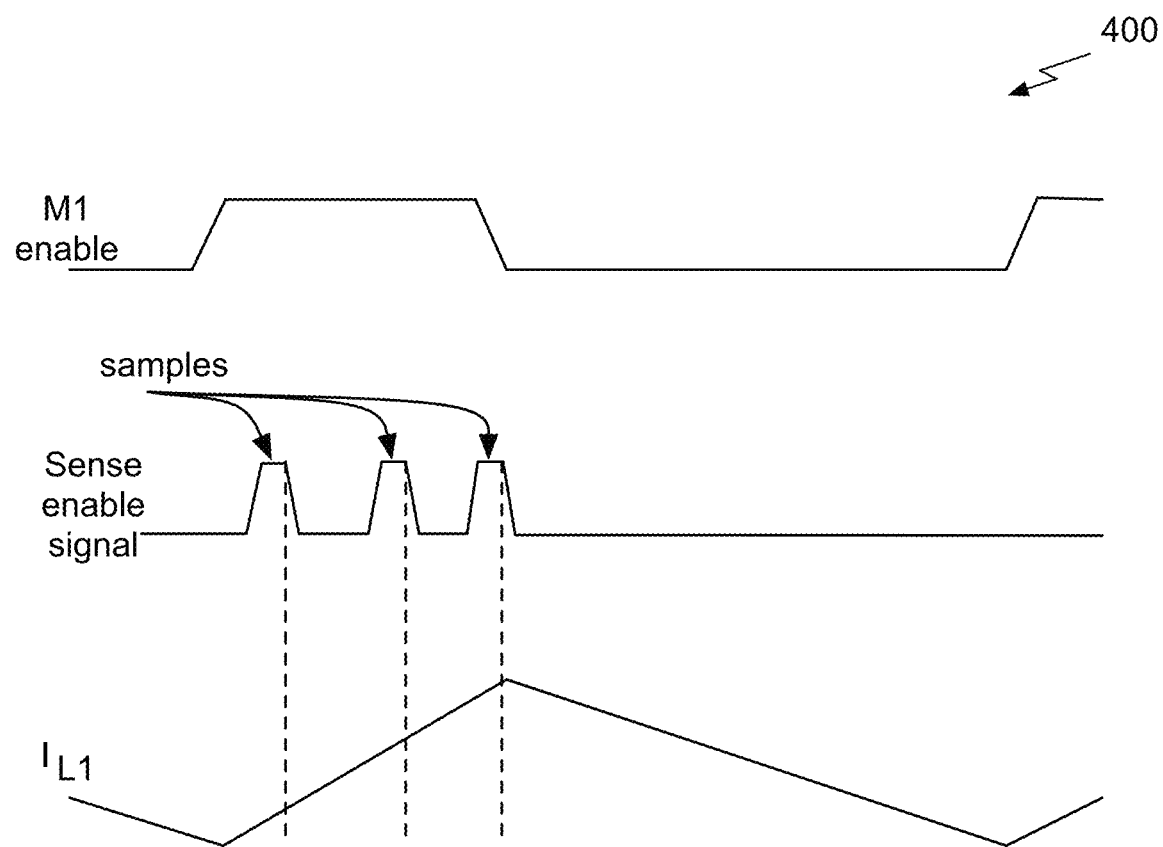
FIG. 4B illustrates waveforms controlling the generation and sampling of current that is provided to the load of the current-parking switching regulator shown in FIGS. 3A and 4A, in accordance with one embodiment.

FIG. 4B illustrates waveforms 400 controlling the generation and sampling of the current $I_{L1}$, in accordance with one embodiment. The M1 enable signal that is generated by the upstream controller 305 enables/disables the switching mechanism M1 (i.e., drives the gate of an NMOS transistor). The sense enable signal that is generated within the current sensing unit 315 or 325 may pulse to sample $V_R$ multiple times while the switching mechanism M1 is enabled. The current $I_{L1}$ increases while the switching mechanism M1 is enabled and the upstream controller 305 may be configured to generate another pulse of the sense enable signal when a sample of $V_R$ indicates that $I_{L1}$ has not exceeded the maximum current.

In one embodiment, the upstream controller 305 may be configured to predict a time when the current will reach a peak value (e.g., the maximum current) based on at least one sample of $V_R$. The upstream controller 305 may linearly interpolate the first two samples of $V_R$ to determine when to generate a pulse of the sense enable signal to capture another sample of $V_R$. The linear interpolation is used to determine when $V_R$ will equal or exceed Vref based on two or more previous samples of $V_R$ while the switching mechanism M1 is enabled.

Figure 4C:
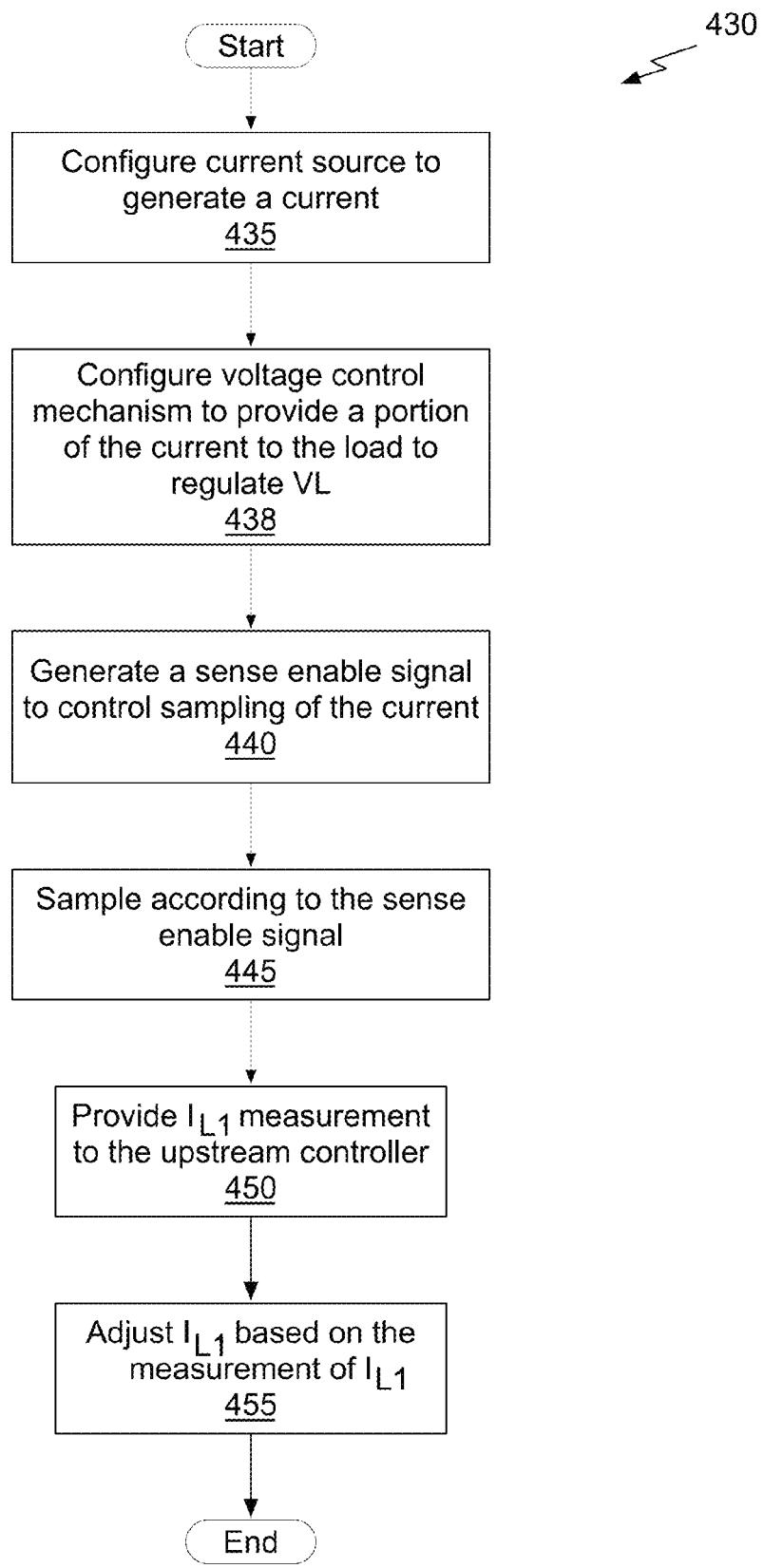
FIG. 4C illustrates a flowchart of a method for controlling the current that is generated based on pulsed sensing of the current provided to the load, in accordance with one embodiment.

FIG. 4C illustrates a flowchart 430 of a method for controlling the current $I_{L1}$ that is generated based on pulsed sensing of the current, in accordance with one embodiment. At step 435, a current source is configured to generate a current $I_{L1}$. At step 438, a voltage control mechanism is configured to provide a portion of the generated current $I_{L1}$ to the load 110 to regulate $V_L$. At step 440, the current sensing unit 315 or 325 generates a pulsed sense enable signal. At step 445, a sense voltage across a resistive sense mechanism is sampled according to the sense enable signal. The sense voltage corresponds to the current $I_{L1}$. At step 450, the sense voltage $V_R$ (i.e., measurement of $I_{L1}$) is provided to the upstream controller 305. At step 455, the upstream controller 305 adjusts $I_{L1}$ based on the measurement of $I_{L1}$.

Figure 4D:
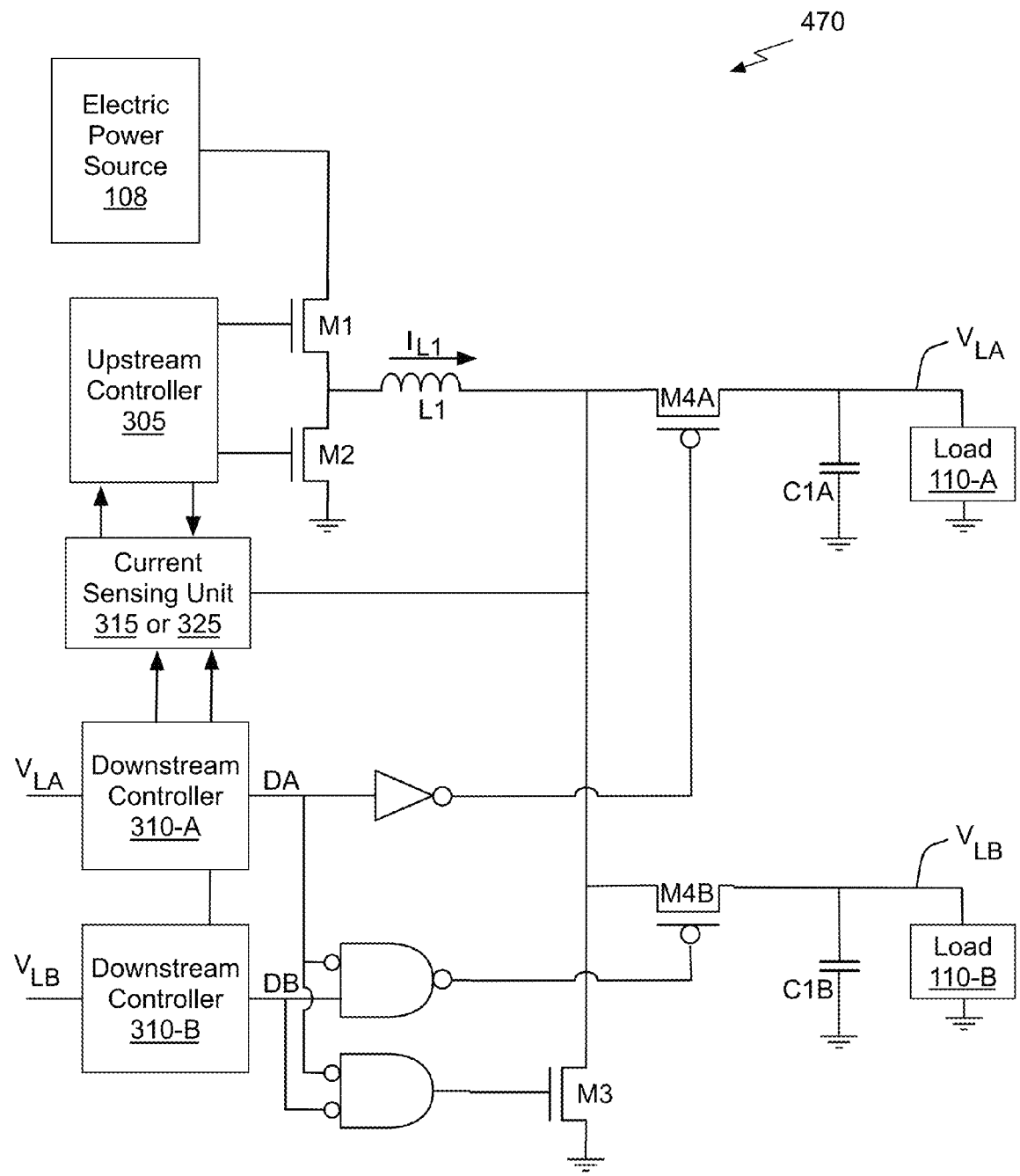
FIG. 4D illustrates a system including a current-parking switching regulator driving two loads using a shared current source and current sensing unit, according to one embodiment.

FIG. 4D illustrates a system 470 including a current-parking switching regulator driving two loads, loads 110-A and 110-B, with independently controller voltages $V_{LA}$ and $V_{LB}$ using a shared current source and current sensing unit 315 or 325, according to one embodiment. As shown in FIG. 5B, the single inductor L1 provides the current $I_{L1}$, a portion of which is provided to each of the two loads 110-A and 110-B. In one embodiment, the portions of the current $I_{L1}$ are not provided to the two loads 110-A and 110-B simultaneously. A filter capacitor C1A is coupled to the load 110-A and a filter capacitor C1B is coupled to the load 110-B. A separate downstream controller 310-A and 310-B and respective switching mechanism M4A and M4B is associated with each of the loads. However, the switching mechanism M3 may be shared by the downstream controllers 310-A and 310-B. The downstream controllers 310-A and 310-B may each be the downstream controller 310.

The D output signals, DA and DB that are generated by the downstream controllers 310-A and 310-B are combined to give operating priority to the load 110-A. In one embodiment, load 110-A is the most critical or highest-current load. When DA is high, the switching mechanism M4A is enabled, coupling the current source to the load 110-A and the switching mechanisms M4B and M3 are both disabled. When the switching mechanism M4A is enabled the current $I_{L1}$ is provided to capacitor C1A and $V_{LA}$ ramps up while $V_{LB}$ ramps down. When DA is low DB may be high, enabling the switching mechanism M4B and disabling the switching mechanisms M4A and M3. When the switching mechanism M4B is enabled current $I_{L1}$ is provided to capacitor C1B and $V_{LB}$ ramps up while $V_{LA}$ ramps down. When DA and DB are both low, the switching mechanism M3 is enabled and both switching mechanisms M4A and M4B are disabled causing the current $I_{L1}$ to be "parked" in the inductor L1 while both $V_{LA}$ and $V_{LB}$ ramp down. The effective duty factor of the system 550 is the duty factor of the signal formed by the logical "OR" of DA and DB.

Because only one of the switching mechanisms M4A and M4B is enabled at a time, a single current sensing unit 315 or 325 may be used to measure the current $I_{L1}$ and provide $V_R$ to the upstream controller 305. Similarly, a single current sensing unit 315 or 325 may be used in the multi-phase switching regulator 150 of FIG. 1B so the resistive sensing mechanism and comparator can be shared across all phases. Alternatively, a separate current sensing mechanism can be provided for each phase so that the current in the inductor for each phase may be controlled independently.

Figure 5A:
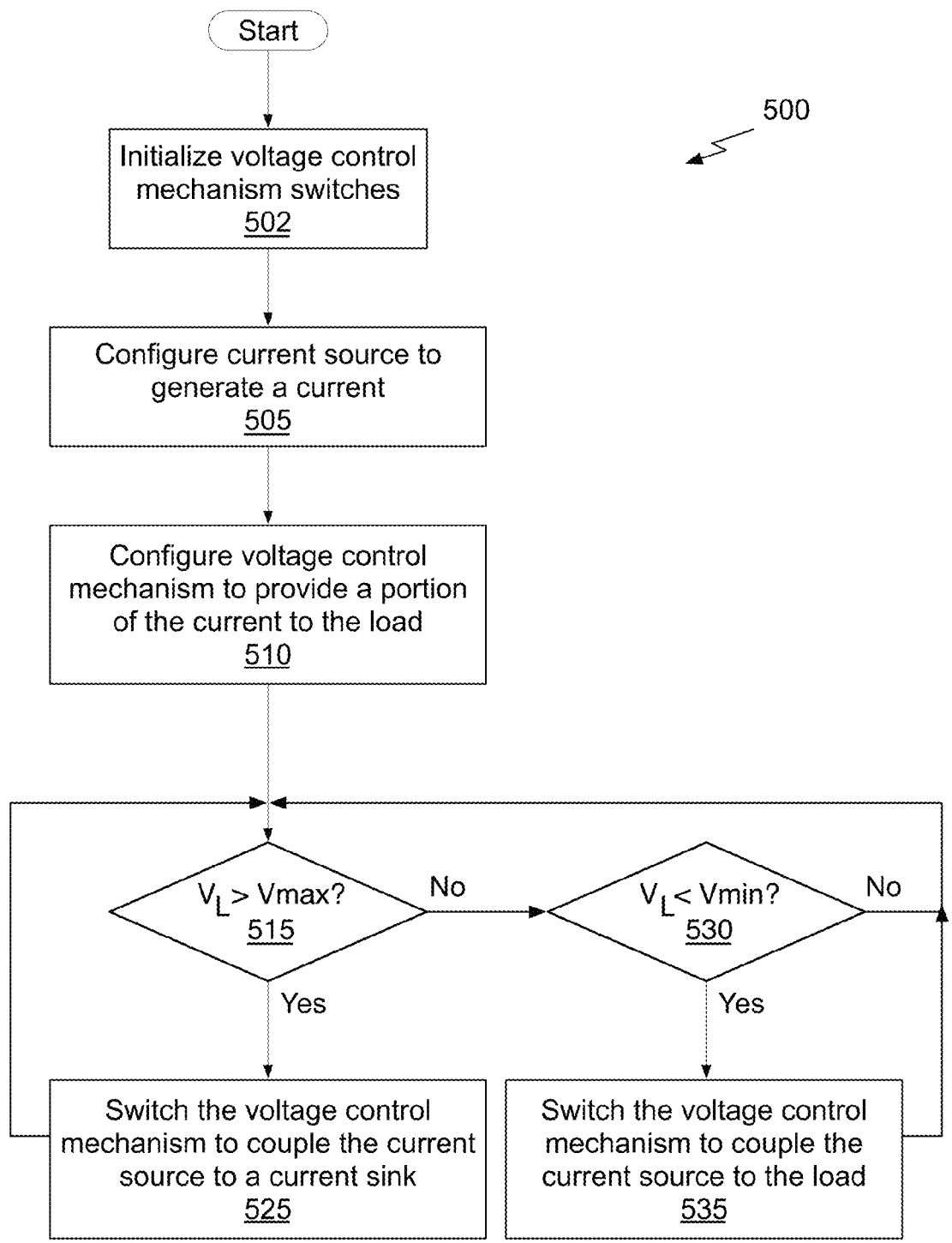
FIG. 5A illustrates a flowchart of a method for regulating the voltage level provided to a load, in accordance with one embodiment.
Figure 5B:
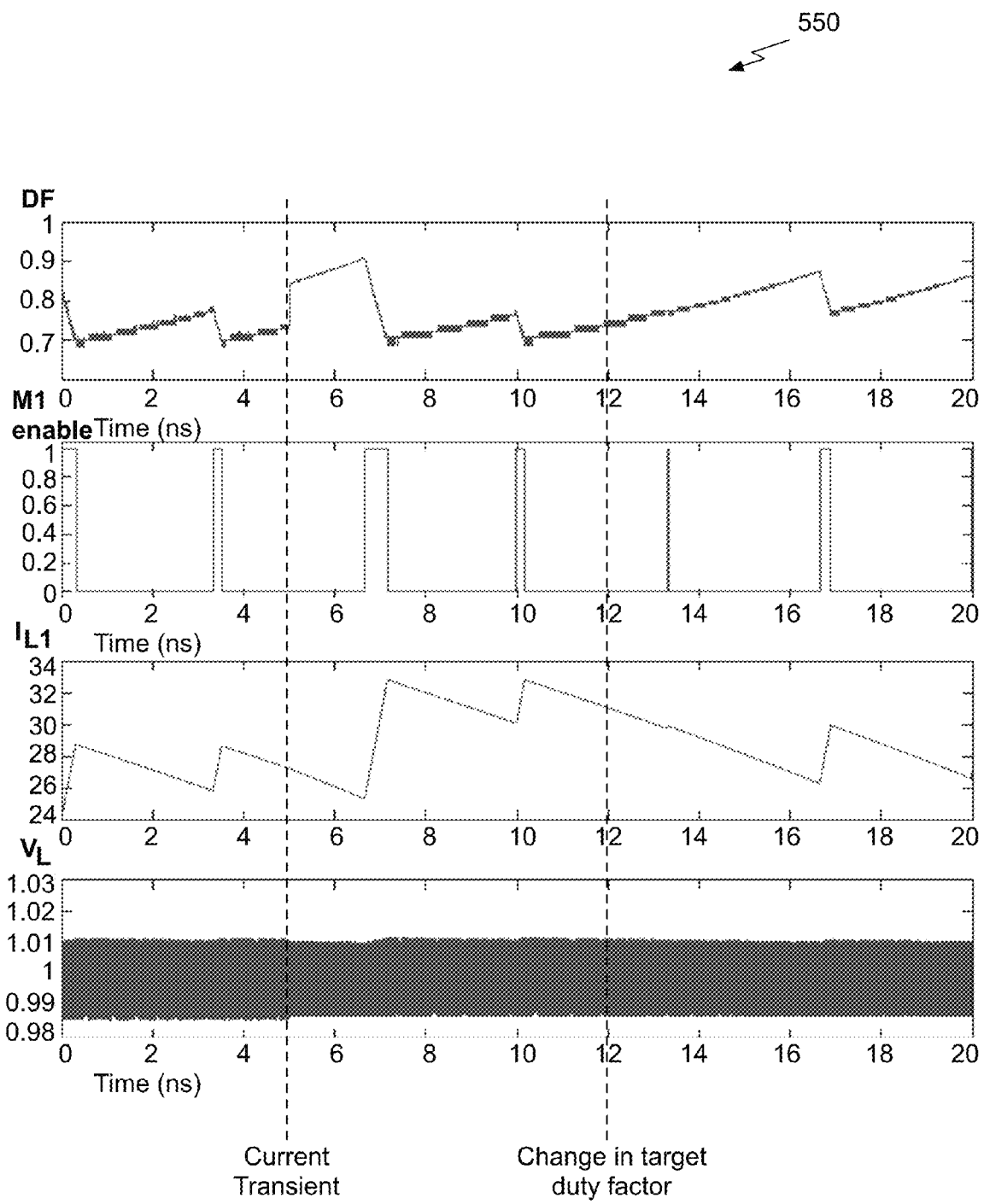
FIG. 5B illustrates waveforms generated by a current-parking switching regulator, in accordance with one embodiment.

FIG. 5A illustrates another flowchart 500 of a method for regulating the voltage level provided to the load 110 or 170 using the downstream controller 310 (or the controller 105 or 165 that includes a downstream controller), in accordance with one embodiment. At step 502, the switching mechanisms in the voltage control mechanism are initialized. Specifically, the switching mechanism M3 is disabled and the switching mechanism M4 is enabled. In another embodiment, the auxiliary supply voltage $V_{ST}$ is provided to the downstream controller, and step 502 is replaced with a step that provides the auxiliary supply to the downstream controller before the electric power 108 source provides a supply voltage to the current source.

At step 505, the upstream controller 305 (or controller 105 or 165) configures the current control mechanism to generate the current $I_{L1}$ through the inductor L1. The current control mechanism may be configured to provide a current that is greater than an average current needed by the load 110 or 170. At step 510, the downstream controller configures the voltage control mechanism to provide a portion of the current to the load 110 or 170 to regulate the voltage level, $V_L$ at the load 110. At step 515, the downstream controller determines if $V_L$ is greater than Vmax, and, if so, then at step 525, the voltage control mechanism is switched to decouple the current source from the load 110 or 170 and to couple the current source (i.e., the inductor L1) to a current sink (i.e., ground) to provide a lesser portion of $I_{L1}$ to the load 110 or 170 to reduce $V_L$. After step 525, the downstream controller returns to step 515.

If, at step 515, $V_L$ is not greater than Vmax, then at step 530, the downstream controller determines if $V_L$ is less than Vmin. If $V_L$ is less than Vmin, then at step 535 the downstream controller configures the voltage control mechanism to couple the current source to the load 110 or 170 and to decouple the current source from the current sink to provide a greater portion of $I_{L1}$ to the load 110 or 170 to increase $V_L$. After step 535, the downstream controller returns to step 515. Otherwise, when $V_L$ is not greater than Vmax and is not less than Vmin (i.e., $V_L$ is within the range bounded by Vmin and Vmax), then the downstream controller returns to step 515.

The portion of the current that is provided to the load 110 or 170 is determined by the signal D that is generated by the downstream controller 310. The signal D that alternately enables the first switching mechanism M4 allowing a portion of the current to flow to the load 110 or 170 while disabling a second switching mechanism M3 and then enables the second switching mechanism to pull the inductor L1 (or L2 for the electric power conversion device 180) to ground while disabling the second switching mechanism to isolate the load 110 or 170 from the inductor. In response to a current transient, the downstream controller 310 quickly increases or decreases the portion of the current that is provided to the load 110 or 170 and maintains the voltage level $V_L$ within a predetermined range bounded by Vmin and Vmax. Specifically, when $V_L$ is greater than Vmax, D goes low to divert current away from load 170 and when $V_L$ is less than Vmin, D goes high to source current to the load 170.

FIG. 5B illustrates waveforms 550 generated by the current-parking switching regulator 302, in accordance with one embodiment. The upstream controller is a PWM controller that maintains the current $I_{L1}$ below a maximum current (as shown in FIG. 4A). The downstream controller may be a bang-bang controller that is configured to maintain $V_L$ within a range bounded by Vmin and Vmax.

The top trace is the duty factor (DF) of the signal D that increases as the current $I_{L1}$ (third trace) decreases to provide constant current to the load. The second trace is the first signal of the enable control signals generated by the upstream controller 305 that is coupled to the switching mechanism M1 (M1 enable). When M1 enable is high the current $I_{L1}$ through the inductor L1 ramps up steeply as the upstream side of the inductor L1 is connected to the (12V) electric power source 108. When M1 enable is low, the current $I_{L1}$ slowly decays as the upstream side of the inductor L1 is connected to GND through the switching mechanism M2.

In the simulation producing the waveforms 550 there is a current transient in the load current $I_{Load}$ from 20 A to 23 A at 5 μs and a step change in the target duty factor from 0.7 to 0.77 at 12 μs. The current transient results in a step increase in the duty factor DF and a step decrease in the operating frequency of the downstream controller 310 (implemented as a bang-bang controller), but the voltage $V_L$ remains in the range bounded by Vmin and Vmax.

Figure 5C:
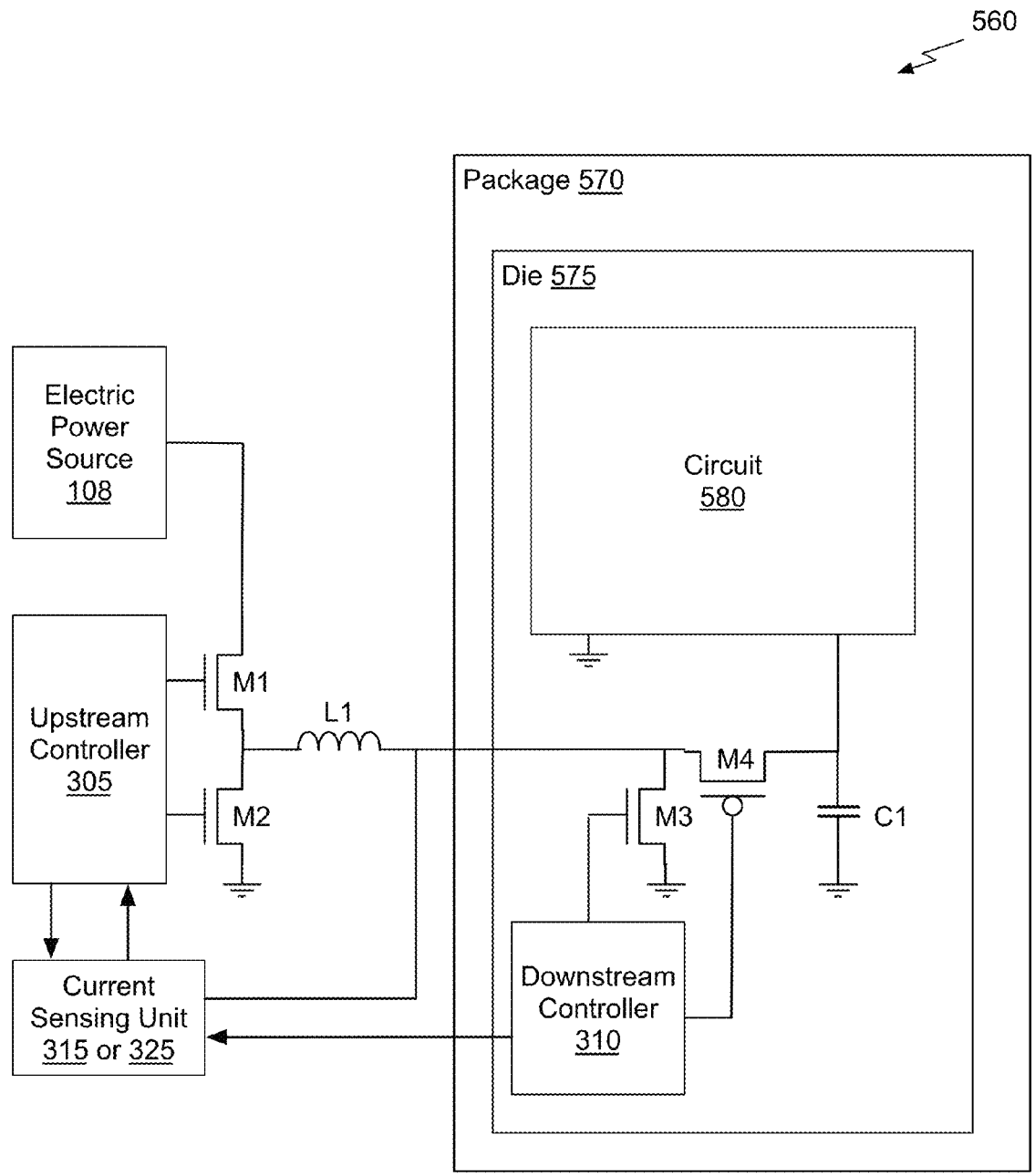
FIG. 5C illustrates a diagram of the current-parking switching regulator within a system, according to one embodiment.

FIG. 5C illustrates a system 560 including a current-parking switching regulator, according to one embodiment. The current-parking switching regulator in the system 560 may be one of the electric power conversion devices 120 and 180 shown in FIGS. 1A and 1C, respectively, or one of the current-parking switching regulators shown in FIGS. 3A and 4A.

The electric power source 108 is coupled to the current control mechanism and the voltage control mechanism of the current-parking switching regulator with the inductor L1. In an alternate embodiment, the electric power source 108 is coupled to the current control mechanism and the voltage control mechanism of the current-parking switching regulator with the inductors L11 and L2. The upstream controller 305 is configured to generate a current through the inductor L1. The downstream controller 510 may be the downstream controller 310 and is configured to regulate the voltage level at the load, i.e., circuit 580. In one embodiment, the downstream controller 510 is configured to maintain the voltage level at the circuit 580 within a predetermined range bounded by Vmin and Vmax.

The inductor L1 is positioned outside of a package 570 that encloses the circuit 580. A second inductor L2 (not shown) may be positioned inside of the package 570, reducing the second parasitic capacitance CPB compared with the first parasitic capacitance CPA, as described in conjunction with FIG. 1C. The second inductor L2, the switching mechanisms M3 and M4 (or M13 and M14), and the capacitor C1 (or C11) may be fabricated as part of the die 575 that includes the circuit 580. In one embodiment, the second inductor L2 a planar air-core inductor and the switching mechanisms M3 and M4 (or M13 and M14) are planar MOS transistors.

A current sensing unit 315 or 325 is coupled between the downstream controller 510 and the upstream controller 305. Although a single phase of the current-parking switching regulator with a split inductor is shown in FIG. 5C, multiple phases of the current-parking switching regulator with a split inductor or a combination of one or more current-parking switching regulators (with or without a split inductor) may be used with one or more conventional electric power conversion devices to provide power to the circuit 580.

Figure 6:
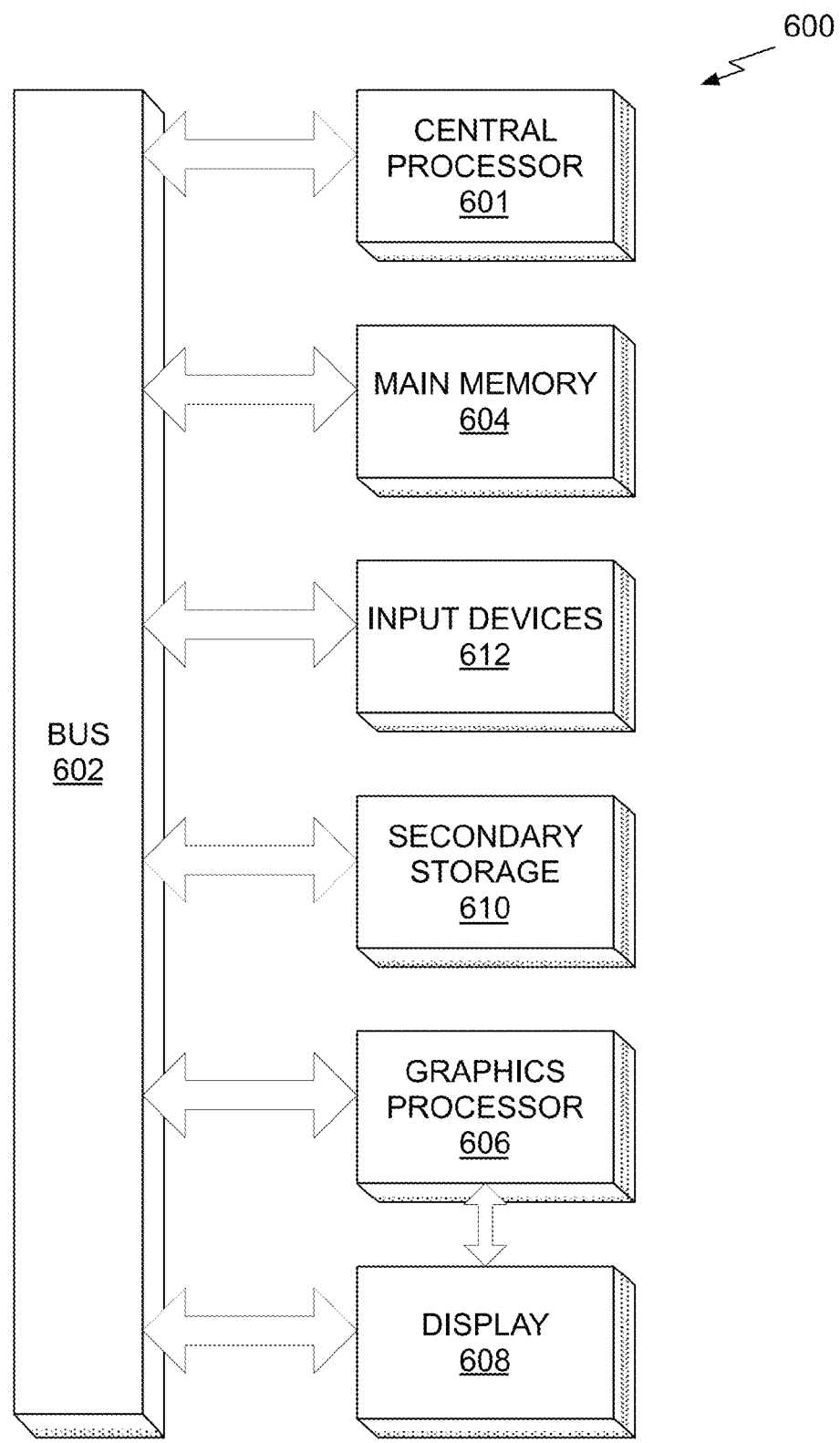
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. One or more of the systems 550 and 500 shown in FIGS. 5A and 5B, respectively, may be incorporated in the system 600 to provide power to one or more of the chips.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 604 and/or the secondary storage 610. Such computer programs, when executed, enable the system 600 to perform various functions. The main memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    configuring a current source to generate a current by alternately enabling a first switching mechanism to couple the current source to an electric power source while disabling a second switching mechanism to decouple the current source from a current sink and then disabling the first switching mechanism to decouple the current source from the electric power source while enabling the second switching mechanism to couple the current source to the current sink;
    generating a pulsed sense enable signal; and
    sampling a sense voltage across a resistive sense mechanism according to the pulsed sense enable signal while the current source is coupled to the electric power source, wherein the sense voltage represents a measurement of the current.

2. The method of claim 1, wherein the resistive sense mechanism comprises a metal-oxide semiconductor (MOS) transistor.

3. The method of claim 2, wherein the resistive sense mechanism further comprises a resistor coupled in series with the MOS transistor.

4. The method of claim 1, wherein the resistive sense mechanism further comprises a bypass mechanism that is enabled by the pulsed sense enable signal.

5. The method of claim 4, wherein the bypass mechanism comprises at least one MOS transistor having lower resistance compared with the resistive sense mechanism.

6. The method of claim 1, wherein the resistive sense mechanism further comprises a bypass mechanism and the pulsed sense enable signal is configured to enable the resistive sense mechanism to sample the sense voltage before enabling the bypass mechanism.

7. The method of claim 1, wherein the enabling and disabling of the first switching mechanism and the enabling and disabling of the second switching mechanism is based on the sense voltage.

8. The method of claim 1, wherein the generating of the pulsed sense enable signal comprises pulsing the pulsed sense enable signal during a time when the first switching mechanism is enabled.

9. The method of claim 8, wherein the generating of the sense enable signal further comprises:
    pulsing the pulsed sense enable signal to produce a first sample; and
    pulsing the pulsed sense enable signal to produce a second sample when the first sample indicates that the current has not reached a peak value.

10. The method of claim 8, wherein the generating of the sense enable signal further comprises:
    pulsing the pulsed sense enable signal to produce a first sample;
    pulsing the pulsed sense enable signal to produce a second sample; and
    predicting a time when the current will reach a peak value based on the first sample and the second sample.

11. The method of claim 7, wherein the generating of the pulsed sense enable signal comprises pulsing the pulsed sense enable signal during a time when the first switching mechanism is enabled and the current source is decoupled from a load.

12. The method of claim 1, wherein the pulsed sense enable signal is asserted when the current is decoupled from a load.

13. The method of claim 1, wherein, prior to the sampling, the pulsed sense enable signal enables the resistive sense mechanism.

14. The method of claim 1, further comprising adjusting an amount of the current that is generated by the current source based on a comparison between a reference voltage and the sense voltage.

15. The method of claim 14, wherein the reference voltage is set according to a processing workload.

16. The method of claim 1, wherein the current is greater than an average current that is needed to regulate an output voltage level at a load.

17. The method of claim 1, wherein the current source comprises an inductor.

18. An electric power conversion device, comprising:
    a current source that is configured to generate a current by alternately enabling a first switching mechanism to couple the current source to an electric power source while disabling a second switching mechanism to decouple the current source from a current sink and then disabling the first switching mechanism to decouple the current source from the electric power source while enabling the second switching mechanism to couple the current source to the current sink; and
    a current sensing unit that is coupled to the current source and configured to:
        generate a pulsed sense enable signal; and
        sample a sense voltage across a resistive sense mechanism according to the pulsed sense enable signal while the current source is coupled to the electric power source, wherein the sense voltage represents a measurement of the current.

19. The electric power conversion device of claim 18, further comprising an upstream controller that is configured to:
   couple the current source to the electric power source to increase the current; and
   decouple the current source from the electric power source to decrease the current.

20. The electric power conversion device of claim 18, wherein the resistive sense mechanism further comprises a bypass mechanism that is enabled by the pulsed sense enable signal.

* * * * *